US012607786B2

(12) United States Patent
Taniguchi et al.

(10) Patent No.: US 12,607,786 B2
(45) Date of Patent: Apr. 21, 2026

(54) OPTICAL FILM AND DISPLAY DEVICE

(71) Applicant: Dai Nippon Printing Co., Ltd., Tokyo (JP)

(72) Inventors: Yukio Taniguchi, Tokyo (JP); Takahiro Takeshima, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 496 days.

(21) Appl. No.: 18/245,018

(22) PCT Filed: Sep. 13, 2021

(86) PCT No.: PCT/JP2021/033615
§ 371 (c)(1),
(2) Date: Mar. 13, 2023

(87) PCT Pub. No.: WO2022/059656
PCT Pub. Date: Mar. 24, 2022

(65) Prior Publication Data
US 2023/0367045 A1 Nov. 16, 2023

(30) Foreign Application Priority Data

Sep. 15, 2020 (JP) ................................. 2020-154785

(51) Int. Cl.
*G02B 5/18* (2006.01)
*H10K 59/80* (2023.01)

(52) U.S. Cl.
CPC ......... *G02B 5/1819* (2013.01); *H10K 59/879* (2023.02); *H10K 59/8791* (2023.02)

(58) Field of Classification Search
None
See application file for complete search history.

(56) References Cited

U.S. PATENT DOCUMENTS 7,645,058 B2   1/2010  Kurokawa et al.
7,690,829 B2   4/2010  Sato et al.
(Continued)

FOREIGN PATENT DOCUMENTS

JP      2001-066407 A      3/2001
JP      2007-180001 A      7/2007
(Continued)

OTHER PUBLICATIONS

International Search Report and Written Opinion (Application No. PCT/JP2021/033615) dated Nov. 30, 2021.
(Continued)

*Primary Examiner* — Robert E. Tallman
(74) *Attorney, Agent, or Firm* — BURR PATENT LAW, PLLC

(57) ABSTRACT

An optical film includes a plurality of optical elements. In a case where a first reference line parallel to a film surface is extended in a horizontal direction from a first optical element, a second optical element adjacent to the first optical element is placed at a predetermined spacing in a direction forming a first angle with respect to the first reference line. A third optical element adjacent to the first optical element is placed at a predetermined spacing in a direction forming a second angle with respect to a second reference line orthogonal to the first reference line and parallel to the film surface. Another optical element is also placed at a predetermined spacing from an adjacent optical element in the direction forming the first angle, and is placed at a predetermined spacing from an adjacent optical element in the direction forming the second angle.

15 Claims, 8 Drawing Sheets

(56)                References Cited

U.S. PATENT DOCUMENTS

| | | | |
|---|---|---|---|
| 7,710,031 B2 | 5/2010 | Kashiwagi et al. | |
| 9,507,059 B2* | 11/2016 | Shim | G02B 5/3025 |
| 2005/0212989 A1* | 9/2005 | Kashiwagi | G02B 3/0056 |
| | | | 349/56 |
| 2007/0279773 A1 | 12/2007 | Johnson et al. | |
| 2015/0042909 A1* | 2/2015 | Sekiguchi | G06F 3/0443 |
| | | | 349/12 |
| 2020/0124909 A1 | 4/2020 | Ueba et al. | |
| 2021/0033790 A1* | 2/2021 | Ward | G09G 3/007 |

FOREIGN PATENT DOCUMENTS

| | | |
|---|---|---|
| JP | 2011-158836 A | 8/2011 |
| JP | 2015-035122 A | 2/2015 |
| JP | 6447654 B2 | 1/2019 |
| WO | 2004/017106 A1 | 2/2004 |
| WO | 2005/083475 A1 | 9/2005 |

OTHER PUBLICATIONS

Japanese Office Action (Application No. 2022-535044) dated Jul. 5, 2022 (with English translation).
Taiwanese Office Action (Application No. 110134400) dated Jun. 11, 2024 (with English translation) (39 pages).
Japanese Office Action (Application No. 2022-149268) dated Nov. 10, 2023 (with English translation) (7 pages).
Korean Office Action (with English translation) dated Jun. 27, 2025 (Application No. 10-2023-7012455).
English translation of International Preliminary Report on Patentability dated Mar. 30, 2023 (Application No. PCT/JP2021/033615).

* cited by examiner

OPTICAL FILM AND DISPLAY DEVICE

TECHNICAL FIELD

The present disclosure relates to an optical film that exerts an optical effect on light for use in display image formation. Further, the present disclosure relates to a display device including the optical film.

BACKGROUND ART

Liquid crystal display devices, which are examples of display devices, have been used in various fields. Further, organic LED (organic light-emitting diode) display devices have recently been coming into wider use.

A liquid crystal display device may show a great change in tint of a display image within a viewing angle due to a change in intensity of light according to a observation angle, leakage of light in an oblique direction, or other reasons. It should be noted that a display image is hereinafter sometimes referred to simply as "image".

Meanwhile, in an organic LED display device, a blue shift in an obliquely-viewed image may occur. The term "blue shift" means a phenomenon in which an image appears more bluish when viewed from an oblique angle than when viewed from the front. That is, even an image that an organic LED display device displays may undergo a great change in tint within a viewing angle due, for example, to such a blue shift.

Such a change in color within a viewing angle may cause deterioration in display quality of an image. To address this problem, the applicant previously proposed, in JP 6447654 B, a technology for suppressing such a change in color. In this technology, multiple types of light differing in color from each other are mixed together within a viewing angle by diffusing light that is emitted from a liquid crystal panel, whereby variations in tint within the viewing angle are reduced.

An optical film of JP 6447654 B includes a plurality of columnar optical elements formed at an interface between a high-refractive-index layer and a low-refractive-index layer. Moreover, these optical elements extend in an elongated manner from one edge of the optical film to the other edge. It should be noted that the optical elements are portions that are also referred to, for example, as "optical functional parts", "optical structures", or "optical interface parts".

Meanwhile, U.S. Pat. No. 9,507,059 B2 proposes an optical film including a plurality of optical elements arrayed two-dimensionally. U.S. Pat. No. 9,507,059 B2 discloses truncated conical optical elements that may uniformly diffuse light in all directions. As the shape of such an optical element, a truncated quadrangular pyramid may be used, for example. Using such truncated quadrangular pyramidal optical elements makes it possible to favorably improve display quality in two directions, such as a right-left direction and an up-down direction, in which good outward appearance counts.

SUMMARY OF INVENTION

The optical film including a two-dimensional array of optical elements may produce moire by overlapping pixels in the upper part of a display device. That is, in the optical film including a two-dimensional array of optical elements, the optical function of the optical elements causes unevenness in luminance or unevenness in transmittance in a plane as observed from a particular direction, thereby possibly forming grid patterns. For example, in a case where the optical elements have the shapes of truncated quadrangular pyramids, the side surface of the optical elements may be lower in transmittance than the distal ends of the optical elements as observed from the front. Further, in a case where the optical elements have the shapes of truncated quadrangular pyramids, there may be changes in transmittance even at ridges of the side surface and at connection of the side surface. Such changes in transmittance may form grid patterns. Further, in a case where the optical elements are diffraction gratings, possible changes in optical function at their connections lead to changes in transmittance that may form grid patterns. Meanwhile, grid patterns are formed between the elements too. Such an overlap between such grid patterns may produce moire. Although the term "moire" usually means a comparatively rough fringe pattern, patterns produced by overlaps are herein collectively referred to as "moire". For example, fine particulate light and dark patterns too are referred to as "moire".

Note here that moire produced by an overlap between two grid patterns can be reduced by tilting one grid pattern with respect to the other grid pattern. This is so-called bias. However, in this technique, simply tilting the whole optical film, for example, in a case where the optical elements of the optical film have the shapes of truncated quadrangular pyramids may cause discomfort to the eyes of a viewer.

Specifically, in a case where an optical film including truncated quadrangular pyramidal optical elements is incorporated into a display device with set up-down and right-left directions, it is usual to make two of the four side surfaces of each of the optical elements parallel to the up-down direction and make the other two side surfaces parallel to the right-left direction. That is, the optical film is placed in such a manner since the display device is usually designed so that the optical characteristics of a display image are axisymmetrical with respect to an up-down direction axis and a right-left direction axis. Note here that in a case where the optical film is simply tilted for reduction of moire, the side surfaces of the optical elements are tilted with respect to the up-down direction or the right-left direction. In so doing, the optical elements bring about an optical function that peaks in a direction tilted with respect to the up-down and right-left directions. This may result in causing discomfort to the eyes of a viewer.

Meanwhile, in a case where truncated conical optical elements are used instead of the truncated quadrangular pyramidal optical elements, the optical function of the optical elements does not change due to the orientation of the optical elements with respect to the pixels. However, in a case where improvement in display quality in two particular directions such as the up-down direction and the right-left direction is particularly desired, it cannot necessarily be said that a good result is produced. Further, duplicating original plates or rolling dies are usually fabricated by cutting a metal plate or a metal layer with a cutting tool. While truncated quadrangular pyramids allow use of linear cutting, truncated cones need rotary cutting and therefore invite increases in time and cost of fabrication.

The present disclosure was made in view of the aforementioned circumstances, and has as an object to provide an optical film that transmits light emitted from pixels for the formation of a display image and that, when the display image is displayed by transmitting the light emitted from the pixels, can suppress a decrease in viewability of the display image due to moire while desirably ensuring the display image optical characteristics that are axisymmetrical with respect to two mutually orthogonal axes on which a pixel array is based and an optical-film-equipped display device including the optical film.

An optical film according to an embodiment is an optical film including a plurality of optical elements. In a case where a first reference line parallel to a film surface is extended in a horizontal direction from a first optical element of the plurality of optical elements, a second optical element adjacent to the first optical element is placed at a predetermined spacing in a direction forming a first angle with respect to the first reference line. A third optical element adjacent to the first optical element is placed at a predetermined spacing in a direction forming a second angle with respect to a second reference line orthogonal to the first reference line and parallel to the film surface. Another optical element[s] of the plurality of optical elements too is placed at a predetermined spacing from an adjacent optical element in the direction forming the first angle, and is placed at a predetermined spacing from an adjacent optical element in the direction forming the second angle.

Centers of ones of the optical elements adjacent to each other in a direction of the first reference line may not be aligned on the first reference line. Centers of ones of the optical elements adjacent to each other in a direction of the second reference line may not be aligned on the second reference line. Each of the optical elements may have side[s] parallel to the first reference line or the second reference line.

Centers of ones of the optical elements adjacent to each other in the direction forming the first angle may be aligned in the direction forming the first angle. Centers of ones of the optical elements adjacent to each other in the direction forming the second angle may be aligned in the direction forming the second angle.

The optical elements may be arrayed at regular pitches in the direction forming the first angle and arrayed at regular pitches in the direction forming the second angle.

The pitches in the direction forming the first angle and the pitches in the direction forming the second angle may each be greater than or equal to 2 μm and less than or equal to 50 μm.

When seen in a direction normal to the film surface, mutually opposite sides of ones of the optical elements adjacent to each other in the direction forming the first angle may be parallel to each other. When seen in the direction normal to the film surface, mutually opposite sides of ones of the optical elements adjacent to each other in the direction forming the second angle may be parallel to each other.

The first angle may be greater than or equal to 5 degrees and less than or equal to 40 degrees.

The second angle may be greater than or equal to 5 degrees and less than or equal to 40 degrees.

Each of the optical elements may have side surface including an element side surface nonparallel to the direction forming the first angle and the direction forming the second angle.

A direction passing through both ends of the element side surface in a direction parallel with the film surface may be nonparallel at an angle different from 45 degrees with respect to the direction forming the first angle and the direction forming the second angle.

An optical film according to an embodiment is an optical film including a plurality of optical elements. The optical elements are arrayed in both a first direction and a second direction that are parallel with a film surface and that intersect each other. When seen in a direction normal to the film surface, tangents to two mutually opposite sides of each of the optical elements are nonparallel to the first direction and the second direction.

An optical film according to an embodiment is an optical film including a plurality of optical elements. The optical elements are arrayed so that centers of the optical elements are located in both a first direction and a second direction that are parallel with a film surface and that intersect each other. When seen in a direction normal to the film surface, tangents to two mutually opposite sides of each of the optical elements are nonparallel to the first direction and the second direction.

An optical film according to an embodiment is an optical film including a plurality of optical elements. The optical elements are arrayed in a first direction and a second direction that are parallel with a film surface and that intersect each other. Each of the optical elements either projects toward one side or another in a direction normal to the film surface to have side surface between distal ends and proximal ends or is depressed toward one side or another in the direction normal to the film surface to have side surface between falling edges and base ends. The side surface include two first element side surfaces that are opposite to each other and two second element side surfaces that are opposite to each other in a direction orthogonal to a direction in which the two first element side surfaces are opposite to each other. Directions respectively normal to the two first element side surfaces are nonparallel with a surface including the first direction and the direction normal to the film surface and a surface including the second direction and the direction normal to the film surface, and/or directions respectively normal to the two second element side surfaces are nonparallel with the surface including the first direction and the direction normal to the film surface and the surface including the second direction and the direction normal to the film surface.

The optical elements may be arrayed at regular pitches in both the first direction and the second direction.

When seen in the direction normal to the film surface, adjacent ones of the optical elements may not be arranged along a surface including the directions respectively normal to the two first element side surfaces and the direction normal to the film surface and may not be arranged along a surface including the directions respectively normal to the two second element side surfaces and the direction normal to the film surface.

When seen in the direction normal to the film surface, a direction parallel with a surface including the directions respectively normal to the two first element side surfaces and the direction normal to the film surface may form an angle of 5 degrees or greater and 40 degrees or less or of 50 degrees or greater and 85 degrees or less with the first direction.

Further, a direction parallel with a surface including the directions respectively normal to the two second element side surfaces and the direction normal to the film surface may form an angle of 5 degrees or greater and 40 degrees or less or of 50 degrees or greater and 85 degrees or less with the first direction.

When seen in the direction normal to the film surface, the optical film may be rectangular. The first direction and the second direction may each be nonparallel with four sides of the rectangular optical film. The four sides may include two first sides that are opposite to each other and two second sides that are opposite to each other in a direction orthogonal to a direction in which the two first sides are opposite to each other. When seen in the direction normal to the film surface, the two first element side surfaces may be opposite to each other in a direction in which the second sides extend and the two second element side surfaces may be opposite to each other in a direction in which the first sides extend.

Ones of the optical elements adjacent to each other in the first direction may be adjacent to each other at a gap from each other in either the direction in which the two first sides are opposite to each other or the direction in which the two second sides are opposite to each other. A first duty defined by dividing a dimension at a midpoint of the direction normal to the film surface between the two first element side surfaces or the two second element side surfaces by a pitch between one of the optical elements and another in the first direction may be greater than or equal to 0.5 and less than or equal to 0.8.

Ones of the optical elements adjacent to each other in the second direction may be adjacent to each other at a gap from each other in either the direction in which the two first sides are opposite to each other or the direction in which the two second sides are opposite to each other. A second duty defined by dividing a dimension at a midpoint of the direction normal to the film surface between the two first element side surfaces or the two second element side surfaces by a pitch between one of the optical elements and another in the second direction may be greater than or equal to 0.5 and less than or equal to 0.8.

Each of the optical elements may have a truncated quadrangular pyramidal shape and have a distal surface parallel to the film surface.

Ridges of the side surface of each of the optical elements may be made in round shapes.

The optical elements may include first elements each of which is a diffraction grating that has a plurality of grooves depressed toward one side or another in the direction normal to the film surface and elongated in a direction parallel with the first sides and in which directions respectively normal to the first element side surfaces formed in each of the grooves are nonparallel with the surface including the first direction and the direction normal to the film surface and the surface including the second direction and the direction normal to the film surface, and second elements each of which is a diffraction grating that has a plurality of grooves depressed toward one side or another in the direction normal to the film surface and elongated in a direction parallel with the second sides and in which directions respectively normal to the second element side surfaces formed in each of the grooves are nonparallel with the surface including the first direction and the direction normal to the film surface and the surface including the second direction and the direction normal to the film surface. The first elements and the second elements may be mixedly arrayed in both the first direction and the second direction.

Further, a display device according to an embodiment includes a display panel including a plurality of pixels arrayed in a first pixel array direction and a second pixel array direction orthogonal to the first pixel array direction and the optical film. The optical film is placed over the plurality of pixels so that the first direction and the second direction in which the optical elements are arrayed are each nonparallel with the first pixel array direction and the second pixel array direction. When seen in a direction normal to a film surface of the optical film, directions respectively normal to the two first element side surfaces are parallel with the first pixel array direction and directions respectively normal to the two second element side surfaces are parallel with the second pixel array direction.

The display panel may be an organic LED panel or a liquid crystal panel.

Each of the pixels may include subpixels arrayed in a PenTile array.

A pitch between one of the optical elements and another may be half as great as or less than a width of each of the subpixels.

The present disclosure makes it possible to, when an display image is displayed by transmitting light emitted from the pixels, suppress a decrease in viewability of the display image due to moire while ensuring the display image optical characteristics that are axisymmetrical with respect to two mutually orthogonal axes on which the pixel array is based.

DESCRIPTION OF EMBODIMENTS

The following describes an embodiment of the present disclosure with reference to the drawings.

It should be noted that terms such as "sheet", "film", and "plate" used herein are not distinguished from one another solely on the basis of the difference in designation. Accordingly, the "sheet" is a concept that also encompasses a member that may be referred to as "film" or "plate". Further, the term "sheet surface (plate surface, film surface)" as used herein refers to a surface along a direction parallel with the plane (surface) of a sheet-like member of interest in a case where the sheet-like member of interest is seen holistically from a large perspective. Furthermore, the term "direction normal to a sheet-like member" refers to a direction normal to a sheet surface of a sheet-like member of interest.

<Display Device>

Figure 1:
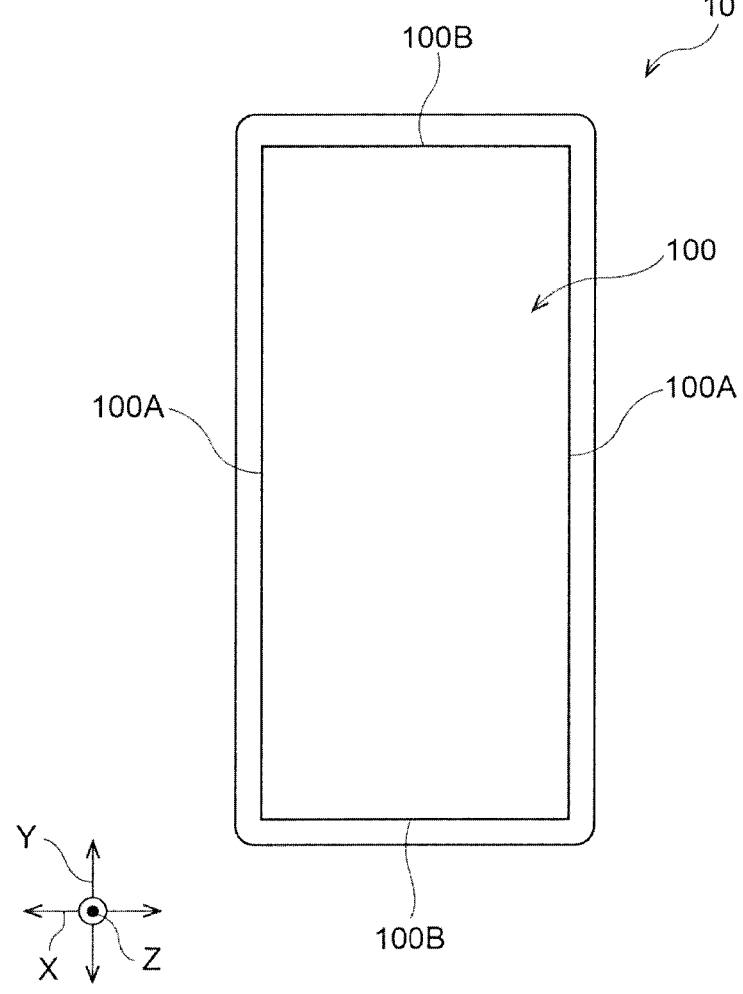
FIG. 1 is a front view of a display device including an optical film according to an embodiment of the present disclosure.
Figure 2:
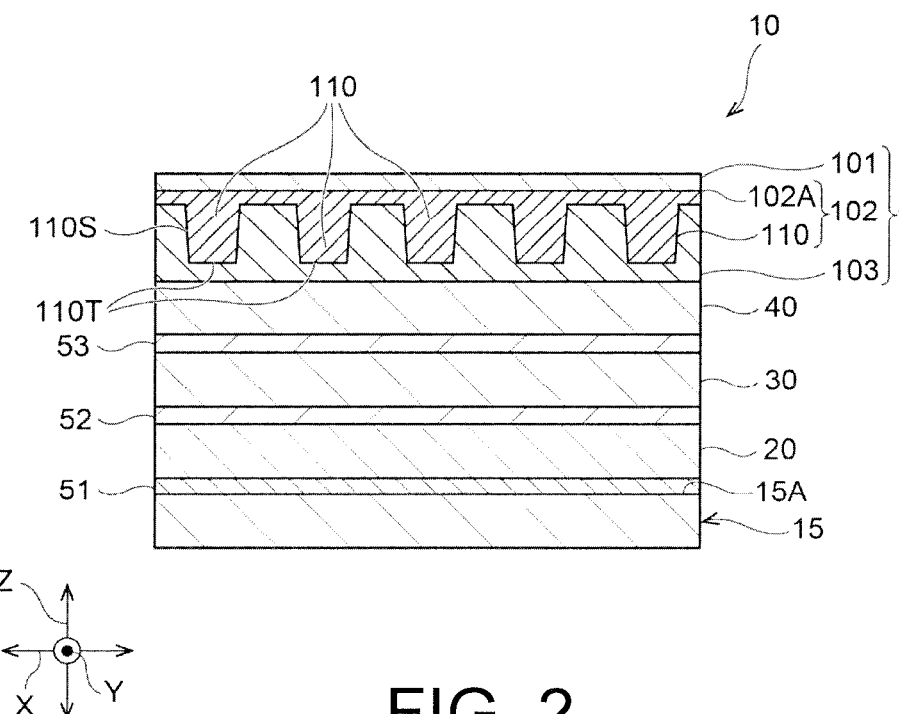
FIG. 2 is a schematic cross-sectional view of the display device according to the embodiment in a thickness direction.

FIG. 1 is a front view of an optical-film-equipped display device 10 (hereinafter referred to simply as "display device 10") including an optical film 100. FIG. 2 is a schematic cross-sectional view of part of the display device 10 in a thickness direction Z of the display device 10. In the present embodiment, the optical film 100 forms a foremost surface of the display device 10. The display device 10 shows a display image to a viewer through the optical film 100.

In the drawings including FIGS. 1 and 2 to which the following description refers, reference sign X denotes a right-left direction of the display device 10. Reference sign Y denotes an up-down direction of the display device 10 orthogonal to the right-left direction X. The thickness direction Z is a direction orthogonal to both the right-left direction X and the up-down direction Y.

As shown in FIG. 1, the optical film 100 of the illustrated example has the shape of a rectangle whose long sides extend in the up-down direction Y. The optical film 100 has two first sides 100A that extend in the up-down direction Y and that are opposite to each other in the right-left direction X and two second sides 100B that extend in the right-left direction X and that are opposite to each other in a direction orthogonal to the direction in which the first sides 100A are opposite to each other, i.e. the up-down direction Y.

As shown in FIG. 2, the display device 10 includes an organic LED (organic light-emitting diode) panel 15, a circularly polarizing plate 20, a touch panel 30, a cover glass 40, and the optical film 100. The organic LED panel 15, the circularly polarizing plate 20, the touch panel 30, the cover glass 40, and the optical film 100 are piled on each other in this order. The organic LED panel 15, the circularly polarizing plate 20, the touch panel 30, and the cover glass 40 each also have the shape of a rectangle whose long sides extend in the up-down direction Y. Although, in the present embodiment, the optical film 100 forms the foremost surface of the display device 10, another layer may form the foremost surface.

The display device 10 is configured, for example, as a smartphone. Note, however, that the display device 10 may be a tablet terminal, a television, a computer display, or a car navigation system.

A display surface (front surface) 15A of the organic LED panel 15 and a back surface of the circularly polarizing plate 20 are bonded together by a first adhesive layer 51. A front surface of the circularly polarizing plate 20 and a back surface of the touch panel 30 are bonded together by a second adhesive layer 52. A front surface of the touch panel 30 and a back surface of the cover glass 40 are bonded together by a third adhesive layers 53. Each of the adhesive layers 51 to 53 is a so-called OCA (optical clear adhesive), and has high light transmittance. Further, the optical film 100 is placed on a front surface of the cover glass 40. In the present example, the optical film 100 and the cover glass 40 are not bonded together by an adhesive layer. Note, however, that the optical film 100 and the cover glass 40 may be bonded together by an adhesive layer.

The organic LED panel 15 is an organic LED panel having a microcavity structure. Note, however, that the organic LED panel 15 may be of another type such as a color filter type. In a common organic LED display device, a blue shift in an obliquely-viewed image may occur and may undergo a great change in color within a viewing angle due to a blue shift. To address this problem, the display device 10 uses the optical film 100 to suppress a change in color within a viewing angle.

The circularly polarizing plate 20 includes a polarizer and a phase difference plate. The phase difference plate is placed beside the organic LED panel 15. The polarizer is joined to a surface of the phase difference plate that faces away from the organic LED panel 15. Specifically, the polarizer is a linear polarizer, and the phase difference plate is a quarter-wavelength phase difference plate. The touch panel 30 includes a transparent glass plate, and is desirably of a capacitive type. The cover glass 40, which has a protective function, may have another function such as an antireflective function.

<Optical Film>

The following describes the optical film 100 in detail. The optical film 100 includes a substrate 101, a low-refractive-index layer 102, and a high-refractive-index layer 103. The substrate 101, the low-refractive-index layer 102, and the high-refractive-index layer 103 are piled on each other in this order from the position of a viewer with respect to the display device 10 toward the organic LED panel 15. In other words, the substrate 101, the low-refractive-index layer 102, and the high-refractive-index layer 103 are piled on each other in this order from a viewer toward the inside of the device in the thickness direction Z.

The substrate 101 has the form of a film, and has a front surface and a back surface, with the back surface joined to the low-refractive-index layer 102. The substrate 101 is a light transmissive transparent substrate composed of resin or glass. The substrate 101 is constituted by a film having, for example, polyethylene terephthalate, polyolefin, polycarbonate, polyacrylate, polyamide, or cellulose triacetate as the main ingredient, glass, or other substances.

The thickness of the substate 101 is for example greater than or equal to 10 $\mu$m and less than or equal to 200 $\mu$m. Further, the refractive index of the substrate 101 is for example higher than or equal to 1.46 and lower than or equal to 1.67. The term "main ingredient" means one of multiple ingredients of a substance that is contained in a proportion of 50% or higher with respect to the whole substance or that is contained most. Further, although, in the present embodiment, the optical film 100 includes the substrate 101, the optical film 100 may not include the substrate 101.

Figure 3:
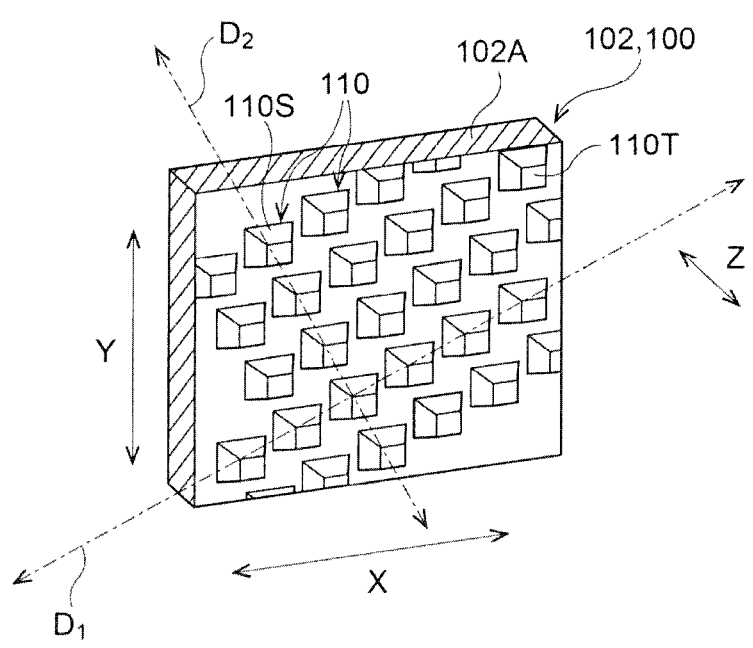
FIG. 3 is a partial perspective view of part of the optical film according to the embodiment.
Figure 4:
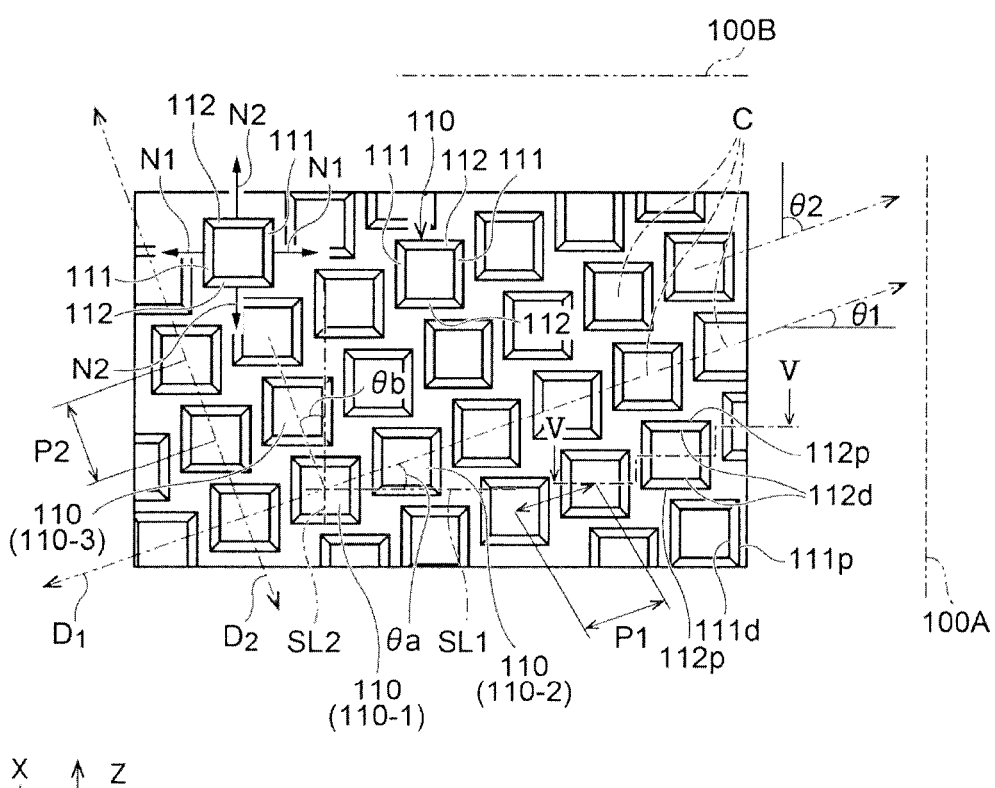
FIG. 4 is a diagram schematically showing an array of lens units (optical elements) of the optical film according to the embodiment.
Figure 5:
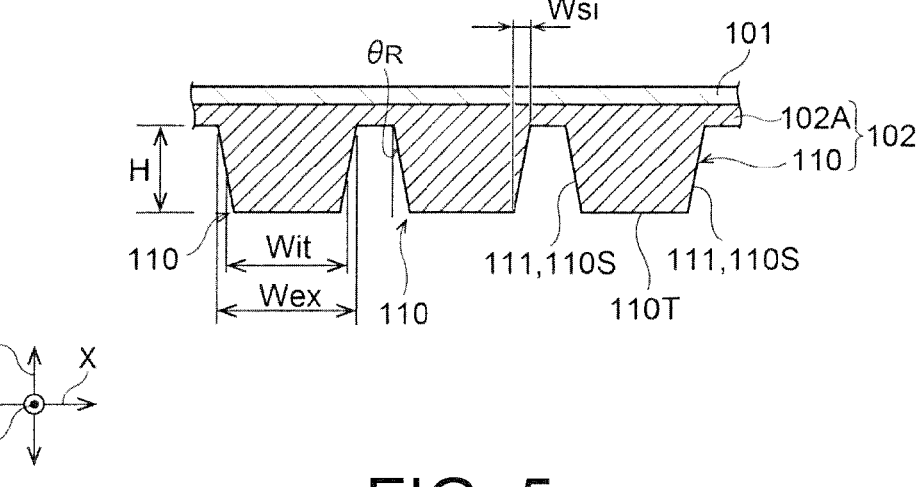
FIG. 5 is a cross-sectional view of the optical film as taken along line V-V in FIG. 4.

FIG. 3 is a partial perspective view of the optical film 100 or, more particularly, is a partial perspective view of the low-refractive-index layer 102. FIG. 4 is a view of the low-refractive-index layer 102 as seen in a direction normal to the low-refractive-index layer 102, i.e. a view of the low-refractive-index layer 102 as seen in the thickness direction Z. FIG. 4 schematically shows an array of the after-mentioned lens units 110 of the low-refractive-index layer 102. FIG. 5 is a cross-sectional view of the optical film 100 as taken along line V-V in FIG. 4.

As shown in FIGS. 2 and 3, the low-refractive-index layer 102 includes a combination of a film layer body 102A having a front surface and a back surface and a plurality of lens units 110 arrayed two-dimensionally along a first direction $D_1$ and a second direction $D_2$ on the back surface of the layer body 102A. The lens units 110 are examples of optical elements. As shown in FIG. 3, the lens units 110 are arrayed along the first direction $D_1$ and the second direction $D_2$, which obliquely intersect both the right-left direction X and the up-down direction Y. FIG. 2 is a schematic cross-sectional view and, for convenience of explanation, shows the lens units 110 in such a manner that the lens units 110 are arranged in the right-left direction X. However, in actuality, the lens units 110 are arranged along the first direction $D_1$ and the second direction $D_2$ in the present embodiment.

The first direction $D_1$ and the second direction $D_2$ are directions that are parallel with a film surface of the optical film 100 and that intersect each other. Further, the first direction $D_1$ and the second direction $D_2$ are each a direction that is nonparallel with the four sides of the optical film 100. The lens units 110 are arrayed at spacings on a plurality of grid lines extending in the first direction $D_1$ and the second direction $D_2$ and forming a grid pattern. The grid lines here are imaginary lines.

The high-refractive-index layer 103 is joined to the low-refractive-index layer 102 so as to cover the lens units 110 and fill spaces between the lens units 110. Thus, in the present embodiment, an interface between the low-refractive-index layer 102 and the high-refractive-index layer 103 has concavo-convex pattern. In so doing, the high-refractive-index layer 103 has the form of a film having a plurality of holes in which the lens units 110 are accommodated, and at least partially takes the form of a grid.

Alternatively, the low-refractive index layer 102 may be constituted by the aggregate of lens units 110 without including the layer body 102A. Further, the optical film 100 may not include the high-refractive-index layer 103. Further, the low-refractive index layer 102 may be dispensable. That is, the low-refractive index layer 102 may be formed by an air layer. In this case, spaces surrounded by grid-like portions of the high-refractive-index layer 103 form optical elements.

The refractive index of the low-refractive-index layer 102 is for example higher than or equal to 1.40 and lower than or equal to 1.55. The refractive index of the high-refractive-index layer 103 is for example higher than or equal to 1.55 and lower than or equal to 1.90, and is higher than the refractive index of the low-refractive-index layer 102. In the present embodiment, for example, the low-refractive-index layer 102 and the high-refractive-index layer 103 are selected so that the difference between the refractive index of the low-refractive-index layer 102 and the refractive index of the high-refractive-index layer 103 falls within a range of 0.05 to 0.50.

Further, although, in the present embodiment, the high-refractive-index layer 103 is placed closer to the organic LED panel 15 than the low-refractive-index layer 102, this order of arrangement may be reversed.

The low-refractive-index layer 102 may be formed, for example, by curing ultraviolet curable resin, electron beam curable resin, or thermosetting resin. In a case where the low-refractive-index layer 102 is formed by curing ultraviolet curable resin, the ultraviolet curable resin may contain acrylic resin, or may contain epoxy resin.

Similarly, the high-refractive-index layer 103 too may be formed, for example, by curing ultraviolet curable resin, electron beam curable resin, or thermosetting resin. In a case where the high-refractive-index layer 103 is formed by curing ultraviolet curable resin, the ultraviolet curable resin may contain acrylic resin, or may contain epoxy resin. Further, in a case where the high-refractive-index layer 103 is formed as an adhesive layer, the high-refractive-index layer 103 may be formed from an acrylic resin adhesive.

Further, a dimension (thickness) of the layer body 102A of the low-refractive-index layer 102 in the thickness direction Z is for example greater than or equal to 0.5 μm and less than or equal to 30 μm. Further, the height of each of the lens units 110 is for example greater than or equal to 1.0 μm and less than or equal to 30 μm. Meanwhile, the thickness of the high-refractive-index layer 103 is for example greater than or equal to 5 μm and less than or equal to 100 μm.

The following details a configuration of each of the lens units 110, which are optical elements.

As shown in FIGS. 3 and 5, each of the lens units 110 has the shape of, for example, a truncated quadrangular pyramid. Each of the lens units 110 has a distal surface 110T parallel to the film surface and side surface 110S located between the distal surface 110T and proximal ends opposite to the distal surface 110T. The side surface 110S form a shape that becomes gradually narrower toward the organic LED panel 15, i.e. toward one side in a direction normal to the film surface of the optical film 100.

As shown in FIG. 4, the side surface 110S include two first element side surfaces 111 that are opposite to each other and two second element side surfaces 112 that are opposite to each other in a direction orthogonal to a direction in which the two first element side surfaces 111 are opposite to each other. The two first element side surfaces 111 and the two second element side surfaces 112 are each a flat surface. Note, however, that at least either the two first element side surfaces 111 or the two second element side surfaces 112 may be curved surfaces or be stepped. Further, each of the lens units 110 may for example have the shape of a quadrangular pyramid, an octagonal pyramid, a truncated octagonal pyramid, or other shapes.

In FIG. 4, reference signs N1 denote directions normal to the two first element side surfaces 111, respectively. As is clear from FIG. 4, each of these directions N1 is nonparallel with a surface including the first direction $D_1$ and the direction normal to the film surface of the optical film 100 and a surface including the second direction $D_2$ and the direction normal to the film surface. Meanwhile, each of the directions N1 is parallel with the second sides 100B of the optical film 100. In other words, each of the directions N1 is parallel with the right-left direction X. Further, the first element side surfaces 111, which are flat surfaces, are parallel to the first sides 100A and the up-down direction Y. Further, the first element side surfaces 111 are opposite to each other in the direction in which the second sides 100B extend, i.e. in the right-left direction X.

Further, reference signs N2 denote directions normal to the two second element side surfaces 112, respectively. Each of these directions N2 too is nonparallel with the surface including the first direction $D_2$ and the direction normal to the film surface of the optical film 100 and the surface including the second direction $D_2$ and the direction normal to the film surface. Meanwhile, each of the directions N2 is parallel with the first sides 100A of the optical film 100. In other words, each of the directions N2 is parallel with the up-down direction Y. Further, the second element side surfaces 112, which are flat surfaces, are parallel to the second sides 100B and the right-left direction X. Further, the second element side surfaces 112 are opposite to each other in the direction in which the first sides 100A extend, i.e. in the up-down direction Y. In the present embodiment, when seen in the direction normal to the film surface, the directions N1 and the directions N2 have such a relationship as to be orthogonal to each other.

That is, in the present embodiment, the lens units 110 are arrayed along the grid pattern formed by the plurality of grid lines extending in the first direction $D_1$ and the second direction $D_2$, which obliquely intersect both the right-left direction X and the up-down direction Y. Meanwhile, the first element side surfaces 111 and the second element side surfaces 112 face in either the right-left direction X or the up-down direction Y. The lens units 110 cause a large portion of light emitted by the organic LED panel 15 to be diffused and deflected from the first element side surfaces 111 along a surface including the directions N1 and the direction normal to the film surface and to be diffused and deflected from the second element side surfaces 112 along a surface including the directions N2 and the direction normal to the film surface. That is, while the surfaces (111 and 112) of the lens units 110 on which an optical function is effectively fulfilled face in the right-left direction X or the up-down direction Y, the first direction $D_1$ and the second direction $D_2$, along which the lens units 110 are arrayed, are inclined with respect to the right-left direction X and the up-down direction Y.

Further, in the present embodiment, as shown in FIG. 4, adjacent lens units 110 of the plurality of lens units 110 are not arranged along the surface including the directions N1 respectively normal to the two first element side surfaces 111 and the direction normal to the film surface or, in other words, are not linearly arranged in a direction parallel with the surface. Further, adjacent lens units 110 of the plurality of lens units 110 are not arranged along the surface including the directions N2 respectively normal to the two second element side surfaces 112 and the direction normal to the film surface or, in other words, are not linearly arranged in a direction parallel with the surface.

It should be noted that the pitch P1 between lens units 110 arrayed in the first direction $D_1$ and the pitch P2 between lens units 110 arrayed in the second direction $D_2$ are equal pitches, i.e. regular pitches, in the present embodiment and assume the same value as each other. Note, however, that the pitches are not limited to equal pitches. Further, as mentioned above, at least either the two first element side surfaces 111 or the two second element side surfaces 112 may be curved surfaces or be stepped. Note here that in a case where the two first element side surfaces 111 and/or the two second element side surfaces 112 are curved surfaces, normal directions defined by at least the widthwise centers of the curved surfaces need only be nonparallel with the surface including the first direction $D_1$ and the direction normal to the film surface of the optical film 100 and the surface including the second direction $D_2$ and the direction normal to the film surface. Further, in a case where the two first element side surfaces 111 and/or the two second element side surfaces 112 are stepped, directions normal to planes including a distal side and a proximal side need only be nonparallel with the surface including the first direction $D_1$ and the direction normal to the film surface of the optical film 100 and the surface including the second direction $D_2$ and the direction normal to the film surface.

Further, the configuration of the lens units 110 as optical elements according to the present embodiment is described in another way below with reference to FIG. 4.

In a case where a first reference line SL1 parallel to the film surface is extended in a horizontal direction from a first lens unit 110 (denoted by reference sign 110-1) of the plurality of lens units 110, a second lens unit 110 (denoted by reference sign 110-2) adjacent to the first lens unit 110 (denoted by reference sign 110-1) is placed at a predetermined spacing in a direction (i.e. the first direction $D_1$) forming a first angle θa with respect to the first reference line SL1. A third lens unit 110 (denoted by reference sign 110-3) adjacent to the first lens unit 110 (denoted by reference sign 110-1) is placed at a predetermined spacing in a direction (i.e. the second direction $D_2$) forming a second angle θb with respect to a second reference line SL2 orthogonal to the first reference line SL1 and parallel to the film surface. Moreover, another lens units 110 of the plurality of lens units 110 too is placed at a predetermined spacing from an adjacent lens unit 110 in the direction forming the first angle θa, and is placed at a predetermined spacing from an adjacent lens unit 110 in the direction forming the second angle θb.

In the present embodiment, the first reference line SL1 is parallel to the second sides 100B of the optical film 100. The second reference line SL2 is parallel to the first sides 100A of the optical film 100.

Moreover, the respective centers C of lens units 110 adjacent to each other in a direction of the first reference line SL1 are not aligned on the first reference line SL1. Further, the respective centers C of lens units 110 adjacent to each other in a direction of the second reference line SL2 are not aligned on the second reference line SL2. Meanwhile, the respective centers C of lens units 110 adjacent to each other in the direction forming the first angle θa are aligned in the direction forming the first angle θa or, accurately, are aligned on a straight line extending in the direction forming the first angle θa. Further, the respective centers C of lens units 110 adjacent to each other in the direction forming the second angle θb are aligned in the direction forming the second angle θb or, accurately, are aligned on a straight line extending in the direction forming the second angle θb. It should be noted that the center of a lens unit 110 refers to the center of the lens unit 110 as seen in the direction normal to the film surface.

Further, each of the lens units 110 has sides parallel to the first reference line SL1 or the second reference line SL2. More specifically, proximal sides 111p and distal sides 111d of the first element side surfaces 111 of the side surface 110S of each of the lens units 110 are parallel to the second reference line SL2. Proximal sides 112p and distal sides 112d of the second element side surfaces 112 are parallel to the first reference line SL1.

Moreover, when seen in the direction normal to the film surface, mutually opposite sides of lens units 110 adjacent to each other in the direction forming the first angle θa are parallel to each other. That is, the sides 111p and 111d of one of the adjacent lens units 110 and the sides 111p and 111d of the other lens unit 110 are parallel to each other. Further, when seen in the direction normal to the film surface, mutually opposite sides of lens units 110 adjacent to each other in the direction forming the second angle θb are parallel to each other. That is, the sides 112p and 112d of one of the adjacent lens units 110 and the sides 112p and 112d of the other lens unit 110 are parallel to each other.

Furthermore, tangents to the proximal sides 111p and tangents to the distal sides 111d of the first element side surfaces 111 of the side surface 110S of each of the lens units 110 are nonparallel to the direction forming the first angle θa (i.e. the first direction $D_1$) and the direction forming the second angle θb (i.e. the second direction $D_2$), and are parallel to the second reference line SL2. Tangents to the proximal sides 112p and tangents to the distal sides 112d of the second element side surfaces 112 are nonparallel to the direction (i.e. the first direction $D_1$) forming the first angle θa and the direction (i.e. the second direction $D_2$) forming the second angle θb, and are parallel to the first reference line SL1. These relationships also hold when the first element side surfaces 111 and the second element side surfaces 112 are curved surfaces.

Further, a direction (that corresponds to the second direction $D_2$ in the present example) passing through both ends of each of the first element side surfaces 111 in a direction parallel with the film surface is nonparallel with the direction forming the first angle θa and the direction forming the second angle θb and, in the present embodiment, is nonparallel at an angle different from 45 degrees. Further, a direction (that corresponds to the first direction $D_1$ in the present example) passing through both ends of each of the second element side surfaces 112 in a direction parallel with the film surface is nonparallel with the direction forming the first angle θa and the direction forming the second angle θb and, in the present embodiment, is nonparallel at an angle different from 45 degrees. It is preferable that the first angle θa be greater than or equal to 5 degrees and less than or equal to 40 degrees. It is preferable that the second angle θb be greater than or equal to 5 degrees and less than or equal to 40 degrees.

Figure 6A:
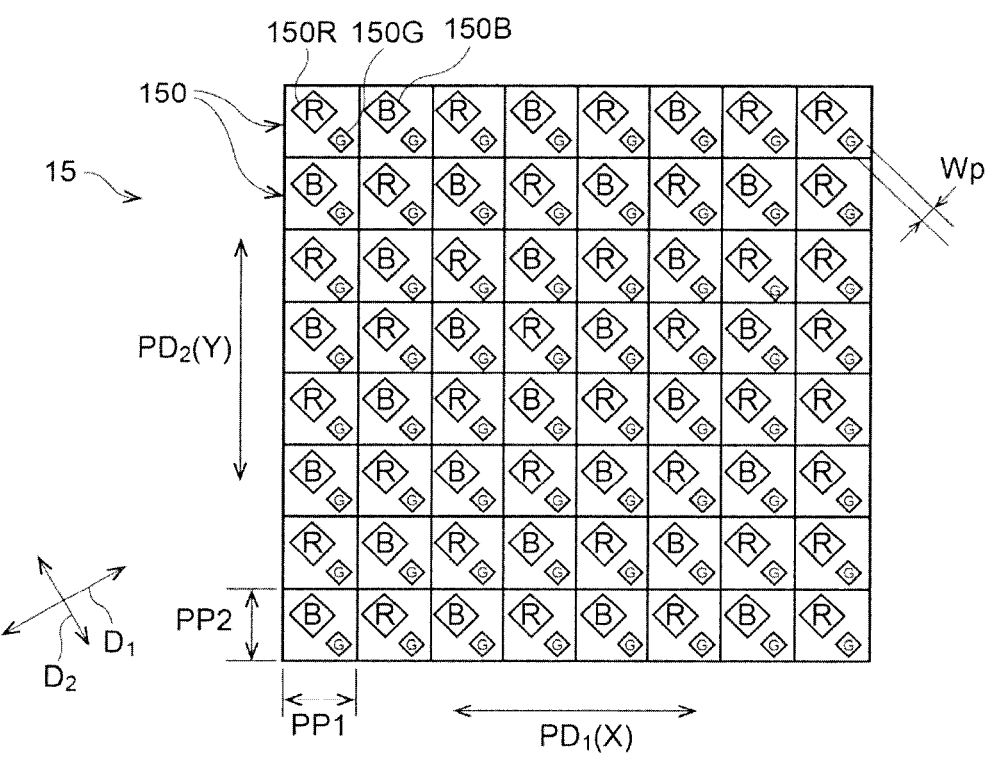
FIG. 6A is a diagram showing a pixel array of an organic LED panel of the display device according to the embodiment.

FIG. 6A is a diagram showing a pixel array of the organic LED panel 15. The organic LED panel 15 includes a plurality of pixels 150 each including a plurality of subpixels differing in color from each other. The pixels 150 are arrayed at equal pitches, i.e. regular pitches, on a plurality of grid lines extending in a first pixel array direction $PD_1$ and a second pixel array direction $PD_2$ orthogonal to the first pixel array direction $PD_1$ and forming a grid pattern.

In each of the pixels 150 according to the present embodiment, the subpixels are arrayed in a Diamond PenTile array, which is an example of a PenTile array. That is, each of the pixels 150 is constituted by a set of a subpixel 150R that emits red light and a subpixel 150G that emits green light or a set of a subpixel 150B that emits blue light and a subpixel 150G that emits green light. Moreover, the subpixels in one pixel 150 are arranged in a direction obliquely intersecting the first pixel array direction $PD_1$ and the second pixel array direction $PD_2$. This obliquely intersecting direction is specifically a direction forming an angle of 45 degrees with each of the first and second pixel array directions $PD_1$ and $PD_2$. Moreover, sets of a subpixel 150R that emits red light and a subpixel 150G that emits green light and sets of a subpixel 150B that emits blue light and a subpixel 150G that emits green light are alternately arrayed. The present embodiment refers to a set of one R subpixel and one G subpixel or a set of one B subpixel and one G subpixel as "pixel", although there is a case where two R subpixels, two B subpixels, and four G subpixels are referred to as "one pixel".

In the present embodiment, the first pixel array direction $PD_1$ corresponds to the right-left direction X, and the second pixel array direction $PD_2$ corresponds to the up-down direction Y. Therefore, the first direction $D_1$ and the second direction $D_2$, along which the lens units 110 are arrayed, are each nonparallel with the first pixel array direction $PD_1$ and the second pixel array direction $PD_2$. Furthermore, in the present embodiment, the first direction $D_1$ and the second direction $D_2$ are each also nonparallel with the direction in which the subpixels are arranged in each of the pixels 150. Moreover, when seen in the direction normal to the film surface of the optical film 100, the directions N1 respectively normal to the two first element side surfaces 111 are parallel with the first pixel array direction $PD_1$, and the directions N2 respectively normal to the two second element side surfaces 112 are parallel with the second pixel array direction $PD_2$.

Figure 6B:
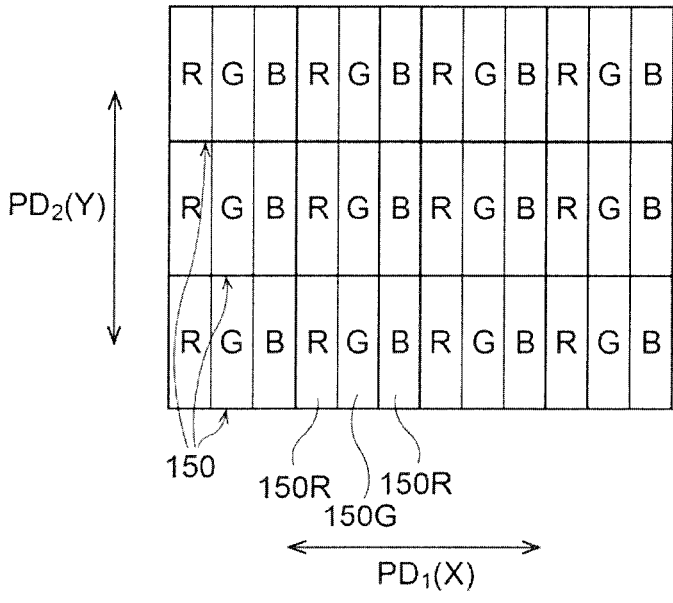
FIG. 6B is a diagram showing a modification of the pixel array shown in FIG. 6A.

That is, while the surfaces (111 and 112) of the lens units 110 on which an optical function is effectively fulfilled face in the first pixel array direction $PD_1$ and the second pixel array direction $PD_2$, the directions along which the lens units 110 are arrayed are inclined with respect to the first pixel array direction $PD_1$ and the second pixel array direction $PD_2$. Furthermore, in the present embodiment, the directions along which the lens units 110 are arrayed are also inclined with respect to the direction of subpixel arrangement obliquely intersecting the first pixel array direction $PD_1$ and the second pixel array direction $PD_2$. The present embodiment employs these configurations to allow the lens units 110 to effectively fulfill their optical function in the first pixel array direction $PD_1$ and the second pixel array direction $PD_2$. At the same time, the grid pattern formed by the array of lens units 110 is inclined with respect to the grid pattern formed by the pixels 150 and a grid pattern formed by the subpixels 150R, 150G, and 150B, whereby moire is reduced or becomes less conspicuous. The array of the subpixels in each of the pixels 150 is not limited to particular arrays but may be a stripe array such as that shown in FIG. 6B.

The following describes the orientation and dimensional conditions of the lens units 110. In FIG. 4, reference sign 91 denotes an angle that a direction parallel with the surface including the directions N1 respectively normal to the two first element side surfaces 111 and the direction normal to the film surface forms with the first direction $D_1$. Reference sign θ2 denotes an angle that a direction parallel with the surface including the directions N2 respectively normal to the two second element side surfaces 112 and the direction normal to the film surface forms with the first direction $D_1$.

It is preferable that each of the angles θ1 and θ2 be greater than or equal to 5 degrees and less than or equal to 40 degrees or, in particular, greater than or equal to 10 degrees and less than or equal to 40 degrees, or be greater than or equal to 50 degrees and less than or equal to 85 degrees or, in particular, greater than or equal to 50 degrees and less than or equal to 80 degrees. More specifically, it is preferable that the angle θ1 be greater than or equal to 5 degrees and less than or equal to 40 degrees and the angle θ2 be greater than or equal to 50 degrees and less than or equal to 85 degrees, or that the angle θ1 be greater than or equal to 50 degrees and less than or equal to 85 degrees and the angle θ2 be greater than or equal to 5 degrees and less than or equal to 40 degrees. More preferably, the angle θ1 is greater than or equal to 10 degrees and less than or equal to 40 degrees and the angle θ2 is greater than or equal to 50 degrees and less than or equal to 80 degrees, or the angle θ1 is greater than or equal to 50 degrees and less than or equal to 80 degrees and the angle θ2 is greater than or equal to 10 degrees and less than or equal to 40 degrees.

In the present embodiment, the aforementioned preferred ranges of the angles θa and θ2 means the following:

It is preferable that the first direction $D_1$ form an angle of 5 degrees or greater and 40 degrees or less or of 50 degrees or greater and 85 degrees or less with the right-left direction X and the first pixel array direction $PD_1$, and it is more preferable that the first direction $D_1$ form an angle of 10 degrees or greater and 40 degrees or less or of 50 degrees or greater and 80 degrees or less with the right-left direction X and the first pixel array direction $PD_1$.

It is preferable that the second direction $D_2$ form an angle of 5 degrees or greater and 40 degrees or less or of 50 degrees or greater and 85 degrees or less with the right-left direction X and the first pixel array direction $PD_1$, and it is more preferable that the second direction $D_2$ form an angle of 10 degrees or greater and 40 degrees or less or of 50 degrees or greater and 80 degrees or less with the right-left direction X and the first pixel array direction $PD_1$.

In a case where an angle that the first direction $D_1$ forms with the right-left direction X and the first pixel array direction $PD_1$ and an angle that the second direction $D_2$ forms with the right-left direction X and the first pixel array direction $PD_1$ meet the aforementioned conditions, moire is effectively reduced or becomes less conspicuous. It should be noted that the closer the angle that the first direction $D_1$ forms with the right-left direction X and the first pixel array direction $PD_1$ is to 0 degree or 45 degrees, the less effectively moire tends to be reduced. That is, in this case, there is almost no difference in overlap of pixel array and optical element array between adjacent subpixels, so that moire tends to increase. It can be said from such a point of view that the aforementioned range of angles is preferred.

It should be noted that the angle that the first direction $D_1$ forms with the right-left direction X and the first pixel array direction $PD_1$ and the angle that the second direction $D_2$ forms with the right-left direction X and the first pixel array direction $PD_1$ are hereinafter collectively referred to as "bias angle". Note here that a bias angle at which a moire reducing effect is suitably brought about can be selected, for example, by calculating a value at which moire is reduced to the minimum. Such a selection can be made, for example, through the following procedure (first to seventh steps).

(First Step)

First, the organic LED panel 15 and the optical film 100 are laid on top of each other at a certain bias angle.

(Second Step)

Next, the amount of decrease in luminance of any subpixel of any pixel 150 of the plurality of pixels 150 is calculated. At this point in time, the distal surfaces 110T of the lens units 110 are treated as being transparent (light transmissive state), and the side surface 110S are treated as shielding (light non-transmissive state). That is, the amount of decrease in luminance is calculated based on the proportion of an area in the subpixel shielded by the side surface 110S.

(Third Step)

Next, the amount of decrease in luminance of a remaining subpixel in the pixel 150 including the subpixel for which the amount of decrease in luminance was calculated in the second step is calculated by the same technique as the second step. Since, in the present embodiment, one subpixel remains in the pixel 150, the third step ends after the amount of decrease in luminance has been calculated for this subpixel. Meanwhile, for example, in the case of a stripe array, two subpixels remain in the pixel 150. In this case, the amount of decrease in luminance of one of the remaining subpixels is calculated first, and then the amount of decrease in luminance of the other remaining subpixel is calculated.

(Fourth Step)

Next, the amount of decrease in luminance of each subpixel in all pixels 150 is identified by executing the second step and the third step for all of the pixels 150. Then, a moire image indicating unevenness in luminance of the subpixels of each color is formed based on information on the amounts of decrease in luminance in all pixels 150.

(Fifth Step)

Next, the maximum and minimum luminances in a moire image regarding each subpixel is identified based on the amount of decrease in luminance, and unevenness in luminance in each subpixel is calculated, for example, by the following formula:

$$\text{Unevenness in Monochromatic Luminance} = (\text{Maximum Luminance} - \text{Minimum Luminance})/(\text{Maximum Luminance} + \text{Minimum Luminance})$$

(Sixth Step)

Next, the average of unevenness in monochromatic luminance of each subpixel is calculated and identified as a representative value of unevenness in luminance.

(Seventh Step)

Then, the second to sixth steps are executed with sequentially varied bias angles, whereby representative values of unevenness in luminance for the plurality of bias angles are identified. Then, a bias angle at which a moire reducing effect is suitably brought about is selected based on the plurality of representative values of unevenness in luminance.

With continued reference to FIG. 4, other dimensions are described. Reference sign P1 denotes the pitch between lens units 110 in the first direction $D_1$. Reference sign P2 denotes the pitch between lens units 110 in the second direction $D_2$. The pitch P1 is for example greater than or equal to 2 μm and less than or equal to 50 μm. The pitch P2 is for example greater than or equal to 2 μm and less than or equal to 50 μm. In the present embodiment, the pitches P1 and P2 are constant in value, and assume the same value as each other. Note, however, that the pitches P1 and P2 may not assume the same value.

In FIG. 5, reference sign H denotes the height of each of the lens units 110 in the thickness direction Z. The height of each of the lens units 110 is for example greater than or equal to 1 μm and less than or equal to 30 μm. Reference sign Wex denotes an exterior width that is the width of each of the lens units 110 between both ends in the right-left direction X. The exterior length Wex is for example greater than or equal to 2 μm and less than or equal to 40 μm. Reference sign Wix denotes an intermediate width that is a dimension of each of the lens units 110 between the two first element side surfaces 111 in the middle of the height of the lens unit 110. The intermediate width Wit is a dimension that is smaller than the exterior width Wex, and is for example greater than or equal to 2 μm and less than or equal to 40 μm. Reference sign Wsi is a side width that is a dimension of one first element side surface 111 in the right-left direction X. The side width Wsi is for example greater than or equal to 0.2 μm and less than or equal to 4 μm. Reference sign OR denotes the angle of inclination of each of the first element side surfaces 111. The angle of inclination $\theta_R$ is for example greater than or equal to 2 degrees and less than or equal to 30 degrees. In the present embodiment, each of the lens units 110 has the shape of a truncated square pyramid. Therefore, an exterior width, an intermediate width, a side width, and an angle of inclination in the up-down direction Y are the same as those in the right-left direction X.

In the present embodiment, optical elements 110 adjacent to each other in the first direction $D_1$ are adjacent to each other at a gap or, in other words, a predetermined spacing from each other in the direction in which the two first sides 100A are opposite to each other. Moreover, each of the two first element side surfaces 111 separately faces a gap in the direction in which the two first sides 100A are opposite to each other. Moreover, a first duty D1 is defined by dividing the intermediate width Wit of each of the two first element side surfaces 111 by the pitch P1 between lens units 110 in the first direction $D_1$. Further, optical elements 110 adjacent to each other in the second direction $D_2$ are adjacent to each other at a gap or, in other words, a predetermined spacing from each other in the direction in which the two second sides 100B are opposite to each other. Moreover, each of the two second element side surfaces 112 separately faces a gap in the direction in which the two second sides 100B are opposite to each other. Moreover, a second duty $D_2$ is defined by dividing the intermediate width of each of the two second element side surfaces 112 by the pitch P2 between lens units 110 in the second direction $D_2$. Note here that it is preferable that each of these first and second duties $D_1$ and $D_2$ be greater than or equal to 0.5 and less than or equal to 0.8.

It should be noted that optical elements 110 adjacent to each other in the first direction $D_1$ may be at gaps from each other in both the direction in which the two first sides 100A are opposite to each other and the direction in which the two second sides 100B are opposite to each other. In this case, there are two types of first duty $D_1$, namely a first duty D1 obtained by dividing the intermediate widths of each of the two first element side surfaces 111 by the pitch P1 and a first duty $D_1$ obtained by dividing the intermediate widths of each of the two second element side surfaces 112 by the pitch P1. In this case, it is preferable that both of the first duties D1 be greater than or equal to 0.5 and less than or equal to 0.8. The same applies to the second duty $D_2$.

When the first duty D1 and the second duty $D_2$ are less than 0.5, a moire reducing effect tends to be hardly brought about by shifting or biasing a grid pattern. Further, when the first duty $D_1$ and the second duty $D_2$ are greater than 0.8, moire tends to increase due to excessive proximity of adjacent lens units 110 to each other. Excessive proximity of adjacent lens units 110 to each other tends to cause an increase in in-plane unevenness of a portion of a subpixel that is shielded by the side surface 110S of the lens units 110. This presumably tends to cause an increase in moire.

Further, in FIG. 6A, reference sign Wp denotes the minimum width of a subpixel in a pixel 150 in planar view. In the present example, the green subpixels 150G are smaller than the other subpixels. Accordingly, the width Wp is the minimum width of a subpixel 150G. Note here that it is preferable that the pitch P between lens units 110 in the first direction $D_1$ and the pitch P2 between lens units 110 in the second direction $D_2$ be half as great as or less than the width Wp of a subpixel. A reason for this is that if approximately one lens unit 110 is located in one subpixel, a moire reducing effect tends to be hardly brought about by bias.

<Workings>

Next, the workings of the display device 10 according to the present embodiment are described.

Refer to FIG. 2. Light emitted from the organic LED panel 15 for image formation passes through the circularly polarizing plate 20, the touch panel 30, and the cover glass 40 and falls on the optical film 100. Of the light falling on the optical film 100, light traveling toward the distal surface 110T of a lens unit 110 or a flat portion of the layer body 102A between adjacent lens units 100 along a front-view direction is emitted from the low-refractive-index layer 102 with no change or almost no change in angle of traveling direction, and does not affect optical characteristics.

Meanwhile, of the light falling on the optical film 100, light traveling toward the side surface 110S of a lens unit 110 is diffused over a wide range. In so doing, in the present example, there is an exchange between light at a high angle and light at a low angle. This reduces a blue shift. Further, according to another design, part of the light thus diffused migrates toward a higher angle. This restrains much light from concentrating in a front-view direction, making it possible to view a high-luminance display image even from an oblique angle.

Note here that each of the lens units 110 has two first element side surfaces 111 and two second element side surfaces 112 as surfaces on which an optical function is effectively fulfilled. Moreover, the first element side surfaces 111 face in the first pixel array direction $PD_1$, and the second element side surfaces 112 face in the second pixel array direction $PD_2$. This allows the lens units 110 to effectively bring about their optical function in the first pixel array direction $PD_1$ and the second pixel array direction $PD_2$. This results in good display quality of a display image in the first pixel array direction $PD_1$ and the second pixel array direction $PD_2$ and, in particular, in good tints in an oblique view on a surface including the first pixel array direction $PD_1$ and the direction normal to the film surface and a surface including the second pixel array direction $PD_2$ and the direction normal to the film surface.

Moreover, the two first element side surfaces 111 are symmetrical about an axis along the second pixel array direction $PD_2$. Further, the two second element side surfaces 112 are symmetrical about an axis along the first pixel array direction $PD_1$. Therefore, in the optical characteristics of a display image, axisymmetry is ensured with respect to the axes in the first pixel array direction $PD_1$ and the second pixel array direction $PD_2$.

Further, the first direction $D_1$ and the second direction $D_2$, along which the lens units 110 are arrayed, are inclined with respect to the first pixel array direction $PD_1$ and the second pixel array direction $PD_2$. Furthermore, in the present embodiment, the first direction $D_1$ and the second direction $D_2$ are also inclined with respect to the direction of subpixel arrangement obliquely intersecting the first pixel array direction $PD_1$ and the second pixel array direction $PD_2$. As a result of this, the grid pattern formed by the array of lens units 110 is inclined with respect to the grid pattern formed by the pixels 150 and the grid pattern formed by the subpixels 150R, 150G, and 150B, whereby moire is effectively reduced or becomes less conspicuous.

Thus, the present embodiment makes it possible to, when an display image is displayed by transmitting light emitted from the pixels 150, suppress a decrease in viewability of the display image due to moire while ensuring the display image optical characteristics that are axisymmetrical with respect to at least either of (in the present embodiment, both of) two mutually orthogonal axes on which the pixel array is based.

The following describes modifications of the aforementioned embodiment. FIGS. 7 to 10 show modifications of the aforementioned embodiment. Those of the constituent elements of the modifications which are identical to those described in the aforementioned embodiment are given identical reference signs, and only differences are described.

<Modifications>

Figure 7:
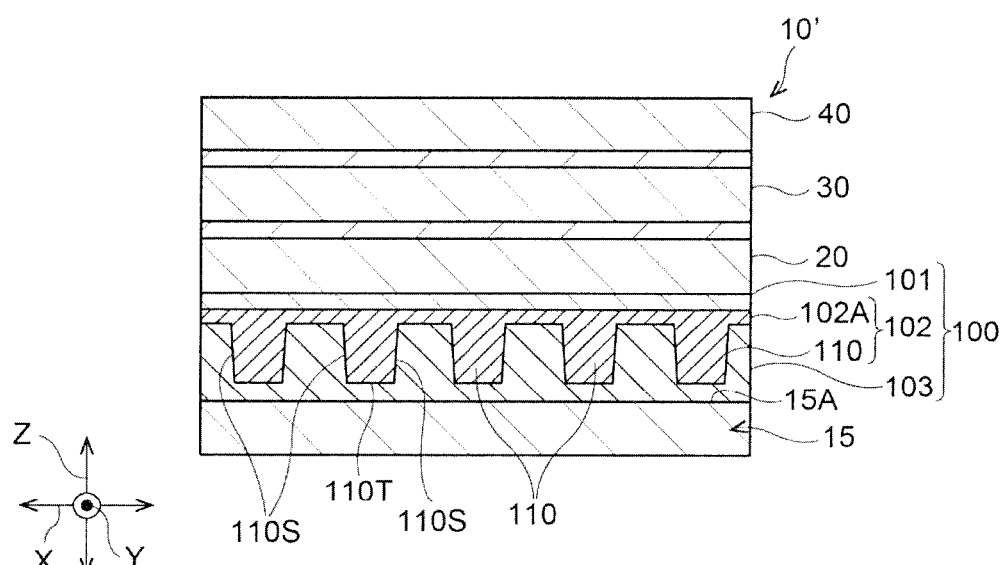
FIG. 7 is a diagram showing a modification of the display device according to the embodiment.

An optical-film-equipped display device 10' according to the modification shown in FIG. 7 includes an organic LED panel 15, an optical film 100, a circularly polarizing plate 20, a touch panel 30, and a cover glass 40. The organic LED panel 15, the optical film 100, the circularly polarizing plate 20, the touch panel 30, and the cover glass 40 are piled on each other in this order. That is, this modification differs from the aforementioned embodiment in position of the optical film 100. Although, in the aforementioned embodiment and the modification shown in FIG. 7, the display panel is an organic LED panel, the display panel may be a liquid crystal panel. It should be noted that as in the aforementioned embodiment, the lens units 110 shown in FIG. 7 are arrayed along the first direction $D_1$ and the second direction $D_2$, which obliquely intersect both the right-left direction X and the up-down direction Y. FIG. 7 is a schematic cross-sectional view and, for convenience of explanation, shows the lens units 110 in such a manner that the lens units 110 are arranged in the right-left direction X. However, in actuality, the lens units 110 are arranged along the first direction $D_1$ and the second direction $D_2$ in the present embodiment.

Figure 8:
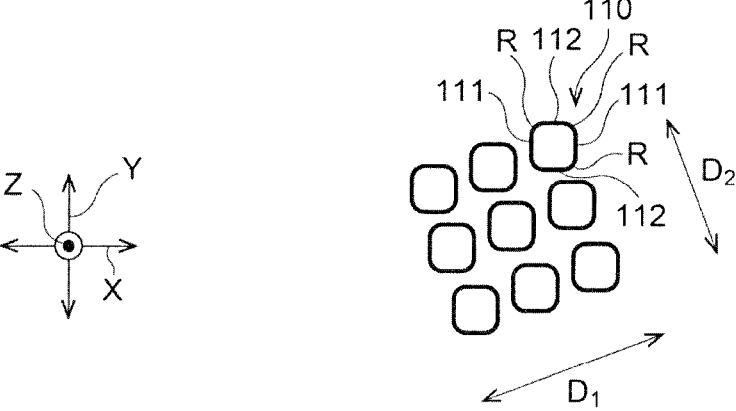
FIG. 8 is a diagram showing a modification of the optical film.

In the modification shown in FIG. 8, the first and second element side surfaces 111 and 112 of each of the truncated quadrangular pyramidal lens units 110 form four corners made in round shapes R. In other words, ridges of the side surface 110S of each of the lens units 110 are made in round shapes R.

A modification of the embodiment shown in FIG. 4 or other drawings may take a form such as that shown in FIG. 8. In the configuration shown in FIG. 8, a portion located between the round shapes R at both ends of each of the first element side surfaces 111 is nonparallel to the surface including the first direction $D_1$ and the direction normal to the film surface of the optical film 100 and the surface including the second direction $D_2$ and the direction normal to the film surface. A portion located between the round shapes R at both ends of each of the second element side surfaces 112 is nonparallel to the surface including the first direction $D_1$ and the direction normal to the film surface of the optical film 100 and the surface including the second direction $D_2$ and the direction normal to the film surface.

Meanwhile, as shown in FIGS. 4 and 8, directions N1 normal to a portion located between the round shapes R at both ends of each of the first element side surfaces 111 is parallel to the second sides 100B of the optical film 100. In other words, each of the directions N1 is parallel with the right-left direction X. Further, a portion located between the round shapes R at both ends of each of the first element side surfaces 111, which are flat surfaces, is parallel to the first sides 100A and the up-down direction Y. Further, the first element side surfaces 111 are opposite to each other in the direction in which the second sides 100B extend, i.e. in the right-left direction X. Furthermore, directions N2 normal to a portion located between the round shapes R at both ends of each of the second element side surfaces 112 is parallel to the first sides 100A of the optical film 100. In other words, each of the directions N2 is parallel with the up-down direction Y. Further, a portion located between the round shapes R at both ends of each of the second element side surfaces 112, which are flat surfaces, is parallel to the second sides 100B and the right-left direction X. Further, the second element side surfaces 112 are opposite to each other in the direction in which the first sides 100A extend, i.e. in the up-down direction Y.

Figure 9:
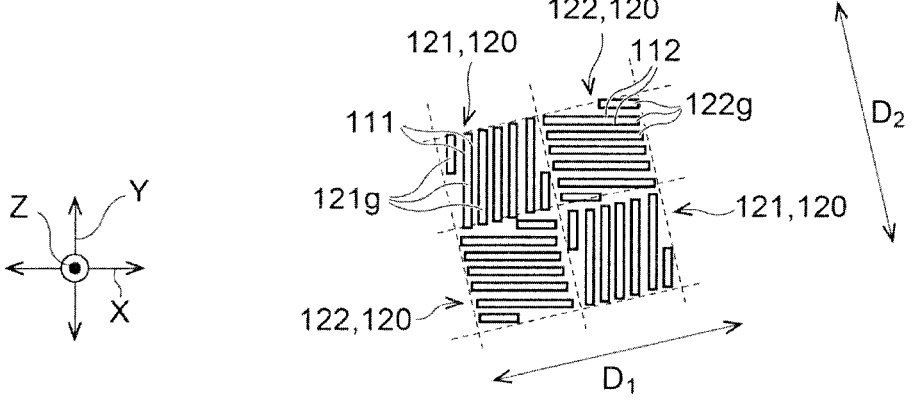
FIG. 9 is a diagram showing a modification of the optical film.

In the modification shown in FIG. 9, the lens units 110 according to the aforementioned embodiment are replaced by optical elements 120 composed of diffraction gratings. The optical elements 120 include first elements 121 and second elements 122.

With reference to FIG. 1 too, each of the first elements 121 includes a diffraction grating that has a plurality of grooves 121g depressed toward one side or the other in the direction normal to the film surface of the optical film 100 and elongated in a direction parallel with the first sides 100A of the optical film 100 and in which directions respectively normal to first element side surfaces 111 formed in each groove 121g are nonparallel with the surface including the first direction $D_1$ and the direction normal to the film surface and the surface including the second direction $D_2$ and the direction normal to the film surface. In each groove 121g, side surface 110S are formed between falling edges and base ends. The term "falling edge" means a portion in which a groove 121g starts to become lower than a foremost surface of the low-refractive-index layer 102 or the high-refractive-index layer 103. The first element side surfaces 111 formed in each groove 121g are nonparallel with the surface including the first direction $D_1$ and the direction normal to the film surface of the optical film 100 and the surface including the second direction $D_2$ and the direction normal to the film surface. With reference to FIGS. 4 and 9, the directions respectively normal to the first element side surfaces 111 formed in each groove 121g are parallel with the second sides 100B of the optical film 100. In other words, each of these directions is parallel with the right-left direction X. Further, the first element side surfaces 111, which are flat surfaces, are parallel to the first sides 100A and the up-down direction Y. Further, the first element side surfaces 111 are opposite to each other in the direction in which the second sides 100B extend, i.e. in the right-left direction X.

Further, each of the second elements 122 includes a diffraction grating that has a plurality of grooves 122g depressed toward one side or the other in the direction normal to the film surface of the optical film 100 and elongated in a direction parallel with the second sides 100B and in which directions respectively normal to second element side surfaces 112 formed in each groove 122g are nonparallel with the surface including the first direction $D_1$ and the direction normal to the film surface and the surface including the second direction $D_2$ and the direction normal to the film surface. In each groove 122g, side surface 110S are formed between falling edges and base ends. The second element side surfaces 112 formed in each groove 122g are nonparallel with the surface including the first direction $D_1$ and the direction normal to the film surface of the optical film 100 and the surface including the second direction $D_2$ and the direction normal to the film surface. With reference to FIGS. 4 and 9, the directions respectively normal to the second element side surfaces 112 formed in each groove 122g are parallel with the first sides 100A of the optical film 100. In other words, each of these directions is parallel with the up-down direction Y. Further, the second element side surfaces 112, which are flat surfaces, are parallel to the second sides 100B and the right-left direction X. Further, the second element side surfaces 112 are opposite to each other in the direction in which the first sides 100A extend, i.e. in the up-down direction Y.

Moreover, the first elements 121 and the second elements 122 are mixedly arrayed in both the first direction $D_1$ and the second direction $D_2$. Note here that the first elements 121 and the second elements 122 are preferably alternately arrayed. In the modification shown in FIG. 9, directions respectively normal to the second element side surfaces 112 of each of the first elements 121 too may be or may not be nonparallel with the surface including the first direction $D_1$ and the direction normal to the film surface and the surface including the second direction $D_2$ and the direction normal to the film surface. Further, directions respectively normal to the first element side surfaces 111 of each of the second elements 122 too may be or may not be nonparallel with the surface including the first direction $D_1$ and the direction normal to the film surface and the surface including the second direction $D_2$ and the direction normal to the film surface.

Figure 10:
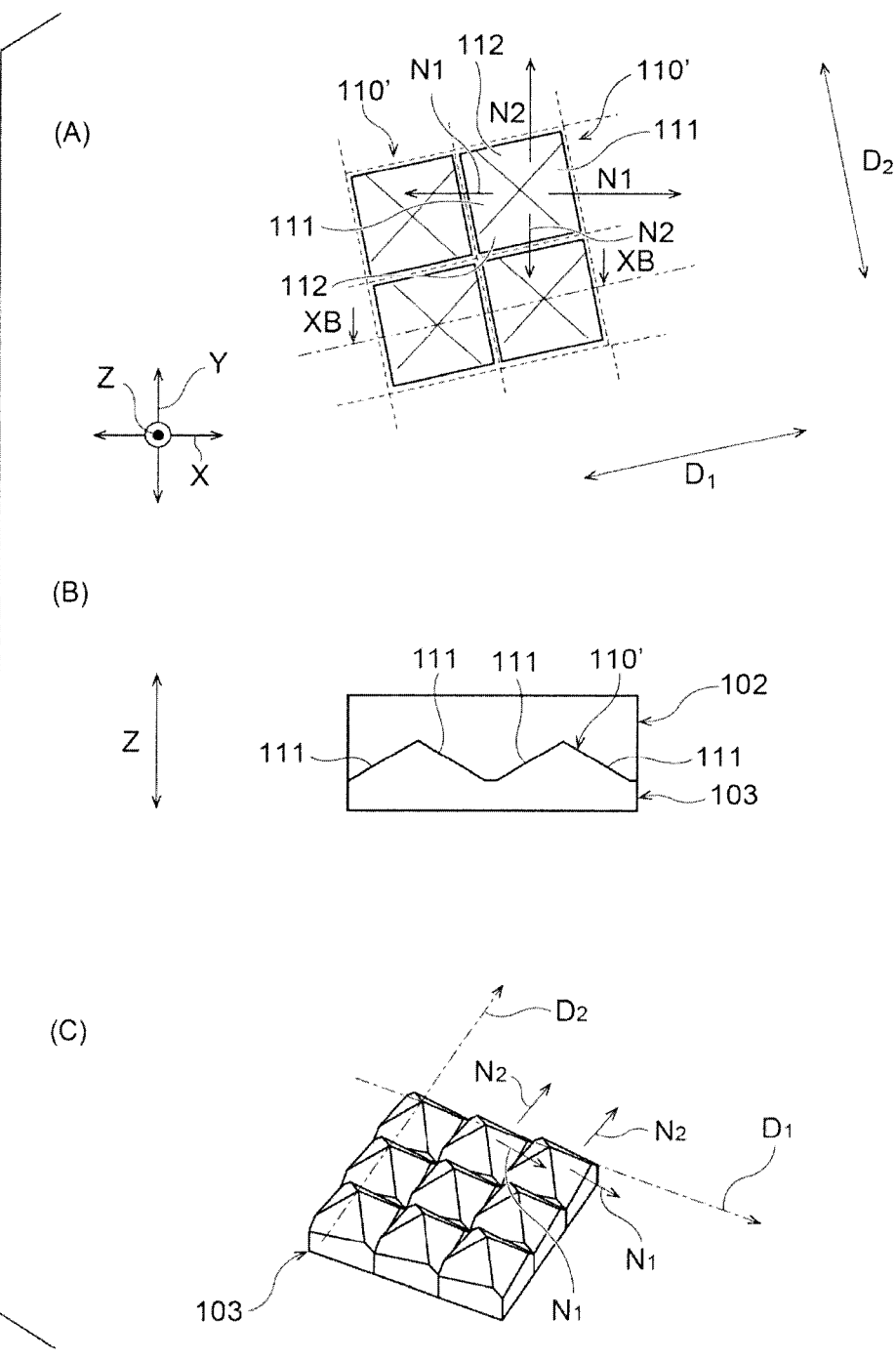
FIG. 10 is a diagram showing a modification of the optical film.

In the modification shown in FIG. 10, the lens units 110 are replaced by optical elements 110' formed by depressions formed in the low-refractive-index layer 102. In FIG. 10, (A) is a view of the optical elements 110' as seen in the thickness direction Z, and (B) is a cross-sectional view taken along line XB-XB in FIG. 10(A). FIG. 10(C) is a higher perspective view of the high-refractive-index layer 103. In the modification shown in FIG. 10, each of the optical elements 110' is formed by a depression depressed in an irregular pyramidal shape. Each of the optical elements 110' has its side surface 110S formed between falling edges and base ends of the depression. The first element side surfaces 111 of the side surface 110S face in the right-left direction X, and directions N1 normal to the first element side surfaces 111 are parallel with the right-left direction X. The second element side surfaces 112 of the side surface 110S face in the up-down direction Y, and directions N2 normal to the second element side surfaces 112 are parallel with the up-down direction Y.

The first element side surfaces 111 are nonparallel to the surface including the first direction $D_1$ and the direction normal to the film surface of the optical film 100 and the surface including the second direction $D_2$ and the direction normal to the film surface. The second element side surfaces 112 are nonparallel to the surface including the first direction $D_1$ and the direction normal to the film surface of the optical film 100 and the surface including the second direction $D_2$ and the direction normal to the film surface.

Meanwhile, with reference to FIGS. 4 and 10(A), each of the directions N1 normal to the first element side surfaces 111 is parallel with the second sides 100B of the optical film 100. In other words, each of the directions N1 is parallel with the right-left direction X. Further, the first element side surfaces 111, which are flat surfaces, are parallel to the first sides 100A and the up-down direction Y. Further, the first element side surfaces 111 are opposite to each other in the direction in which the second sides 100B extend, i.e. in the right-left direction X. Furthermore, each of the directions N2 normal to the second element side surfaces 112 is parallel with the first sides 100A of the optical film 100. In other words, each of the directions N2 is parallel with the up-down direction Y. Further, the second element side surfaces 112, which are flat surfaces, are parallel to the second sides 100B and the right-left direction X. Further, the second element side surfaces 112 are opposite to each other in the direction in which the first sides 100A extend, i.e. in the up-down direction Y.

As shown in FIG. 10(C), the high-refractive-index layer 103 is provided with multiple pyramidal projections that are buried in the depressed optical elements 110'. Each of the projections has the shape of a quadrangular pyramid with four surfaces including two surfaces having normal lines corresponding to a normal line N1 and two surfaces having normal lines corresponding to a normal line N2. For convenience of explanation, FIG. 10(C) shows the normal lines N1 and N2 in such a manner that the normal lines N1 and N2 are projected on the film surface. The projections of the high-refractive-index layer 103 are placed at predetermined direction $D_2$ too are arranged in a mode of arrangement that is similar to that of the projections arranged in the first direction $D_1$, albeit in a different direction.

Accordingly, both ends of the falling edges of the first element side surfaces 111 of each of the optical elements 110' are out of alignment with each other in the direction of the normal line N1 in a case where the normal line N1 is projected on the film surface, i.e. the right-left direction X. Moreover, adjacent ones of the optical elements 110' are positioned with mutually opposite proximal sides parallel to each other. This causes the optical elements 110' to be arranged in the first direction $D_1$, which is different from the direction of the normal line N1 in a case where the normal line N1 is projected on the film surface, i.e. from the right-left direction X. The optical elements 110' arranged in the second direction $D_2$ too are arranged in a mode of arrangement that is similar to that of the optical elements 110' arranged in the first direction $D_1$, albeit in a different direction.

Examples

Next, Examples 1 to 3 of the present disclosure and Comparative Examples 1-1 to 1-3 and 2-1 to 2-3 thereof are described.

(Conditions Such As Dimensions and Arrangements)

In Examples 1 to 3 of the present disclosure, optical films 100 including lens units 110 shaped in conformance with the dimensions shown in Table 1 below were prepared (also refer to FIGS. 4 and 5). Then, display devices 10 separately including each of the optical films 100 laid over the pixels 150 of an organic LED panel 15 at a bias angle θ1 shown in Table 1 were configured.

TABLE 1

| Unit | Height H μm | Pitch (both P1 and P2) μm | Angle of inclination θR deg | Bias angle θ1 (θ2 = 90 deg − θ1) deg | Duty: intermediate width/pitch (both first and second) NA | Intermediate width Wit μm | Side width Wsi μm | Exterior width Wex μm |
|---|---|---|---|---|---|---|---|---|
| Example 1 | 4.2 | 6 | 12 | 25 | 0.7 | 4.2 | 0.893 | 4.646 |
| Example 2 | 4.2 | 8.6 | 12 | 20 | 0.7 | 6.02 | 0.893 | 6.466 |
| Example 3 | 4.2 | 12.9 | 12 | 25 | 0.7 | 9.03 | 0.893 | 9.476 | pitches in the first direction $D_1$ and placed at predetermined pitches in the second direction $D_2$. As is clear from the illustration, the normal lines of the projections of the high-refractive-index layer 103 corresponding to the normal lines N1 and N2 are nonparallel to the first direction $D_1$ and the second direction $D_2$.

In this example, both ends of the respective proximal sides of the two surfaces of each of the projections of the high-refractive-index layer 103 having normal lines corresponding to the normal line N1 are out of alignment with each other in a direction of the normal line N1 in a case where the normal line N1 is projected on the film surface. Moreover, adjacent ones of the projections of the high-refractive-index layer 103 are positioned with mutually opposite proximal sides parallel to each other. This causes the projections of the high-refractive-index layer 103 to be arranged in the first direction $D_1$, which is different from the direction of the normal line N1 in a case where the normal line N1 is projected on the film surface. The projections of the high-refractive-index layer 103 arranged in the second Each of Comparative Examples 1-1 to 1-3 includes an optical film including lens units of the same dimensions as the lens units 110 of Examples 1 to 3, and the lens units are arrayed along a grid pattern formed by grid lines parallel to the right-left direction X and the up-down direction Y. That is, Comparative Examples 1-1 to 1-3 have no bias angles.

Further, each of Comparative Examples 2-1 to 2-3 includes an optical film including lens units of the same dimensions as the lens units 110 of Examples 1 to 3, and the lens units are arrayed in the same direction as the direction of array of the lens units 110 of Examples 1 to 3; however, each of the lens units has four side surfaces inclined with respect to the right-left direction X and the up-down direction Y (parallel to the direction of a bias angle).

Further, the organic LED panels of Comparative Examples are identical to the organic LED panels 15 of Examples.

Figure 11:
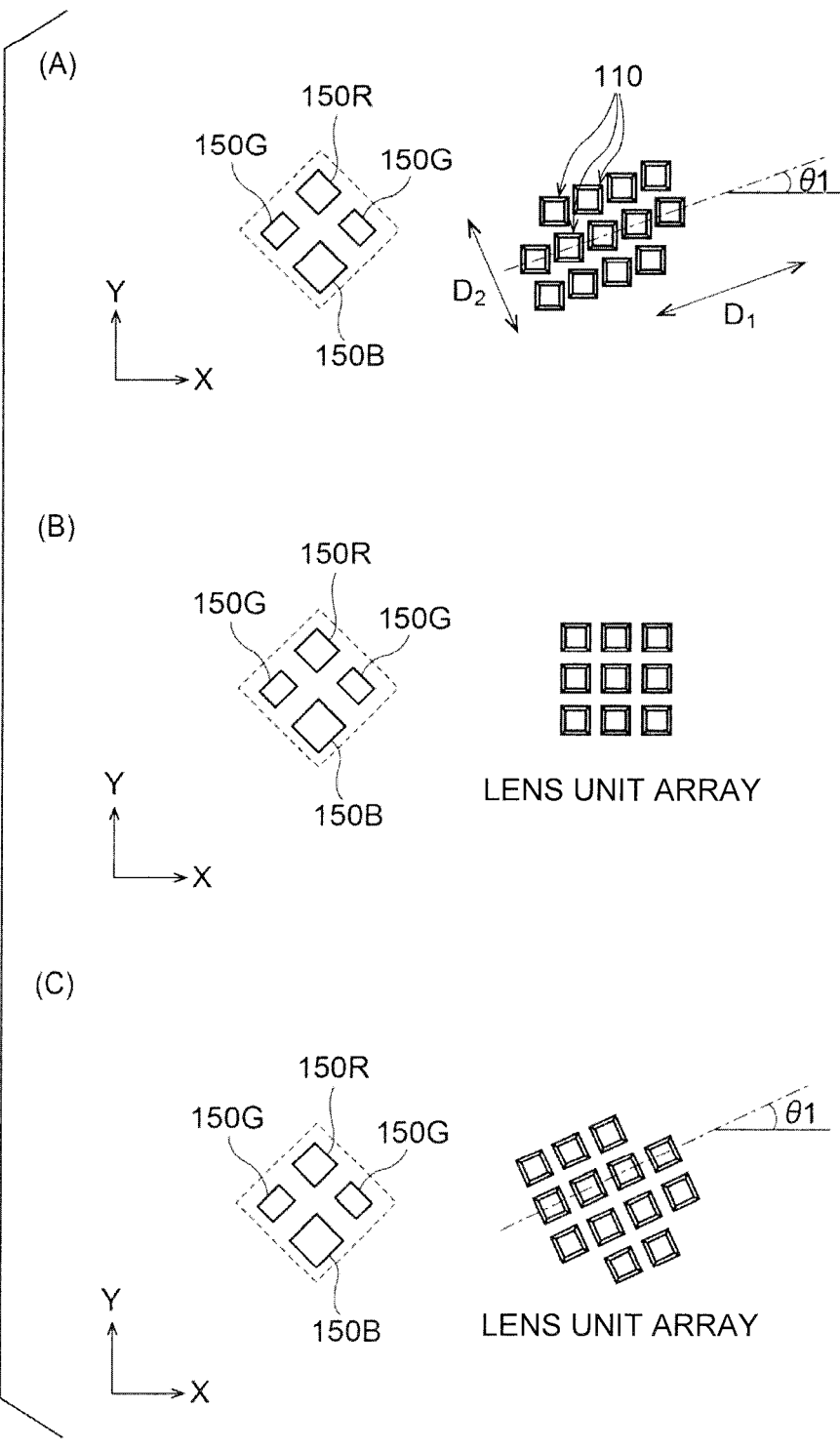
FIG. 11 is a diagram schematically showing a positional relationship between pixels and lens units of the optical film in each of Examples and Comparative Examples 1 and 2.

FIG. 11 is a diagram showing arrays of lens units and arrays of subpixels of Example and Comparative Examples. FIG. 11(A) shows an array of lens units 110 and an array of subpixels of Examples 1 to 3. FIG. 11(B) shows an array of lens units and an array of subpixels of Comparative Examples 1-1 to 1-3. FIG. 11(C) shows an array of lens units and an array of subpixels of Comparative Examples 2-1 to 2-3.

The lens units 110 (low-refractive-index layers 102) of Examples 1 to 3 are made of acrylic ultraviolet curable resin, and have a refractive index of 1.48. The lens units (low-refractive-index layers) of Comparative Examples are made of the same material as those of Examples. With reference to FIG. 6A, the pitch PP1 between pixels 150 in the first pixel array direction $PD_1$ in each of the organic LED panels 15 of Examples is 55.5 µm, and the pitch PP2 between pixels 150 in the second pixel array direction $PD_2$ is 55.5 µm. The width Wp of a green subpixel 150G is 15.8 µm. A set of one R subpixel and one G subpixel or a set of one B subpixel and one G subpixel is herein referred to as "pixel", although, in the Diamond Pen Tile array thus illustrated, two R subpixels, two B subpixels, and four G subpixels constitute one unit.
(Evaluation Methodology)

In evaluating Examples and Comparative Examples, a solid white image was displayed in each of Examples and Comparative Examples, and the color coordinates x and y of the solid white image in all directions were measured. The color coordinates x and y are color coordinates x and y defined by the CIE 1931 color space (CIE xyY color space). The color coordinates x and y were measured by using a TOPCON CORPORATION's color luminance meter BM-7.

Further, for evaluation of changes in color as viewed from the front and an oblique angle, color coordinates x and y in a front view (0 degree) and color coordinates x and y as viewed from an oblique angle of 45 degrees inclined rightward in the right-left direction X with respect to the front view were identified. Then, the color coordinates x and y thus identified were converted into color coordinates u' and v' of a uniform color space. The color coordinates u° and v' were calculated from the following Formulas (1-1) and (1-2), respectively.

[Math. 1]

$$u' = \frac{4x}{-2x + 12y + 3} \qquad (1\text{-}1)$$

$$v' = \frac{9y}{-2x + 12y + 3} \qquad (1\text{-}2)$$

Further, a change in color Δu'v' of light that is emitted in a direction at 45 degrees with respect to the color of light that is emitted in a front-view direction was calculated from the color coordinates u' and v'. The change in color Δu'v' represents a difference in color, and the smaller value it assumes, the smaller is the difference in color between the color of light that is emitted in the front-view direction and the color of light at 45 degrees. The value of Δu'v' at an angle θ within a viewing angle is expressed by the following Formula (2). Substituting the values of 0 degree and 45 degrees in θ of Formula (2) can give a change in color at a visual angle of 45 degrees.

[Math. 2]

$$\Delta u'v'(\theta) = \sqrt{(u'(\theta) - u'(0))^2 + (v'(\theta) - v'(0))^2} \qquad (2)$$

Further, for evaluation of intensity of moire, a numerical value of unevenness in luminance was calculated in each of Examples and Comparative Examples. The unevenness in luminance was calculated according to the aforementioned second to sixth steps. The smaller value the unevenness in luminance assumes, the higher the level of reduction of moire is.

Further, in each of Examples and Comparative Examples, the axisymmetry of a display image with respect to an up-down direction axis and a right-left direction axis was visually evaluated based on an angle distribution of color coordinates x and y identified in all directions. In Examples 1 to 3 and Comparative Examples 1-1 to 1-3, in which the four side surfaces of each of the lens units face in the right-left direction or the up-down direction, the axisymmetry of a display image with respect to the up-down direction axis and the right-left direction axis is ensured. On the other hand, in Comparative Examples 2-1 to 2-3, in which the four side surfaces of each of the lens units do not face in the right-left direction or the up-down direction, the axisymmetry of a display image with respect to the up-down direction axis and the right-left direction axis is not ensured. According to the result of the evaluation of axisymmetry in Tables 2 to 4 below, the sign "0" is used to indicate a case where the axisymmetry of a display image with respect to the up-down direction axis and the right-left direction axis is ensured, and the sign "x" is used to indicate a case where the axisymmetry of a display image with respect to the up-down direction axis and the right-left direction axis is not ensured.

The color coordinates x and y at 0 degree and 45 degrees, the color coordinates u' and v° at 0 degree and 45 degrees, the change in color Δu'v', the value of unevenness in luminance, and the result of evaluation of the axisymmetry of optical characteristics in each of Example 1 and Comparative Examples 1-1 and 2-1 are shown in Table 2 below.

TABLE 2

| | Color coordinate x (0 deg) | Color coordinate y (0 deg) | Color coordinate x (45 deg) | Color coordinate y (45 deg) | Color coordinate u' (0 deg) | Color coordinate v' (0 deg) |
|---|---|---|---|---|---|---|
| Example 1 | 0.311084 | 0.321813 | 0.299747 | 0.316721 | 0.199426 | 0.464184 |
| Comparative Example 1-1 | 0.310895 | 0.321634 | 0.29924 | 10.316525 | 0.199362 | 0.464057 |
| Comparative Example 2-1 | 0.310765 | 0.321444 | 0.298875 | 10.316087 | 0.199343 | 0.463933 |

| | Color coordinate u' (45 deg) | Color coordinate v' (45 deg) | Δu'v' | Unevenness in luminance | Axisymmetry of optical characteristics |
|---|---|---|---|---|---|
| Example 1 | 0.193349 | 0.459671 | 0.00757 | 0.0041 | o |
| Comparative | 0.193064 | 0.459485 | 0.007783 | 0.0055 | o |

TABLE 2-continued

| | | | | | |
|---|---|---|---|---|---|
| Example 1-1 Comparative Example 2-1 | 0.192969 | 0.459184 | 0.007948 | 0.0039 | x |

The color coordinates x and y at 0 degree and 45 degrees, the color coordinates u' and v' at 0 degree and 45 degrees, the change in color Δu'v', the value of unevenness in luminance, and the result of evaluation of the axisymmetry of optical characteristics in each of Example 2 and Comparative Examples 1-2 and 2-2 are shown in Table 3 below.

assumed in the absence of an optical film. The unevenness in luminance of Example 1 is further suppressed than the unevenness in luminance of Comparative Example 1-1. Further, the unevenness in luminance of Example 1 is about equal to the unevenness in luminance of Comparative Example 2-1. Meanwhile, the axisymmetry of the optical

TABLE 3

| | Color coordinate x (0 deg) | Color coordinate y (0 deg) | Color coordinate x (45 deg) | Color coordinate y (45 deg) | Color coordinate u' (0 deg) | Color coordinate v' (0 deg) |
|---|---|---|---|---|---|---|
| Example 2 | 0.31242 | 0.32283 | 0.29689 | 0.31501 | 0.19998 | 0.46494 |
| Comparative Example 1-2 | 0.31197 | 0.32229 | 0.2967 | 0.31521 | 0.19987 | 0.46458 |
| Comparative Example 2-2 | 0.31221 | 0.32277 | 0.29636 | 0.31509 | 0.19985 | 0.46488 |

| | Color coordinate u]' (45 deg) | Color coordinate v' (45 deg) | Δu'v' | Unevenness in luminance | Axisymmetry of optical characteristics |
|---|---|---|---|---|---|
| Example 2 | 0.19197 | 0.45828 | 0.01042 | 0.0041 | ○ |
| Comparative Example 1-2 | 0.19176 | 0.45837 | 0.01021 | 0.0094 | ○ |
| Comparative Example 2-2 | 0.19156 | 0.45825 | 0.01062 | 0.0033 | x |

The color coordinates x and y at 0 degree and 45 degrees, the color coordinates u° and v° at 0 degree and 45 degrees, the change in color Δu'v°, the value of unevenness in luminance, and the result of evaluation of the axisymmetry of optical characteristics in each of Example 3 and Comparative Examples 1-3 and 2-3 are shown in Table 4 below.

characteristics of a display image can be ensured in Example 1, but not in Comparative Example 2-1. Accordingly, Example 1 has an advantage over Comparative Examples 1-1 and 1-2 in reducing changes in color and moire while ensuring the axisymmetry of optical characteristics. The

TABLE 4

| | Color coordinate x (0 deg) | Color coordinate y (0 deg) | Color coordinate x (45 deg) | Color [coordinate y (45 deg) | Color coordinate u' (0 deg) | Color coordinate v' (0 deg) |
|---|---|---|---|---|---|---|
| Example 3 | 0.313047 | 0.323174 | 0.294469 | 0.315552 | 0.200286 | 0.465222 |
| Comparative Example 1-3 | 0.313377 | 0.32269 | 0.294275 | 0.314107 | 0.200705 | 0.465007 |
| Comparative Example 2-3 | 0.313099 | 0.323013 | 0.293927 | 0.313088 | 0.200385 | 0.465142 |

| | Color coordinate u' (45 deg) | Color coordinate v' (45 deg) | Δu'v' | Unevenness in luminance | Axisymmetry of optical characteristics |
|---|---|---|---|---|---|
| Example 3 | 0.190051 | 0.458231 | 0.012395 | 0.0058 | ○ |
| Comparative Example 1-3 | 0.190447 | 0.457383 | 0.012781 | 0.0092 | ○ |
| Comparative Example 2-3 | 0.190577 | 0.456751 | 0.012907 | 0.0058 | x |

A comparison among Example 1 and Comparative Examples 1-1 and 2-1 shows that the change in color Δu'v' of Example 1 is about equal to the changes in color Δu'v' of Comparative Examples 1-1 and 2-1, and all of the changes in color Δu'v' are lower than a value of 0.01617, which is same applies to a comparison among Example 2 and Comparative Examples 1-2 and 2-2 and a comparison among Example 3 and Comparative Examples 1-3 and 2-3.

From the foregoing results of evaluation of Examples, the efficacy of the present embodiment was confirmed. It should be noted that Comparative Examples do not mean conventional technologies and are not necessarily excluded from the invention.

The invention claimed is:

1. An optical film comprising a plurality of optical elements, wherein the optical elements are arrayed in a first direction and a second direction that are parallel with a film surface and that intersect each other, each of the optical elements either projects toward one side or another in a direction normal to the film surface to have side surface between distal ends and proximal ends or is depressed toward one side or another in the direction normal to the film surface to have side surface between falling edges and base ends, the side surface include two first element side surfaces that are opposite to each other and two second element side surfaces that are opposite to each other in a direction orthogonal to a direction in which the two first element side surfaces are opposite to each other, directions respectively normal to the two first element side surfaces are nonparallel with a surface including the first direction and the direction normal to the film surface and a surface including the second direction and the direction normal to the film surface, and/or directions respectively normal to the two second element side surfaces are nonparallel with the surface including the first direction and the direction normal to the film surface and the surface including the second direction and the direction normal to the film surface.

2. The optical film according to claim 1, wherein the optical elements are arrayed at regular pitches in both the first direction and the second direction.

3. The optical film according to claim 1, wherein when seen in the direction normal to the film surface, adjacent ones of the optical elements are not arranged along a surface including the directions respectively normal to the two first element side surfaces and the direction normal to the film surface and are not arranged along a surface including the directions respectively normal to the two second element side surfaces and the direction normal to the film surface.

4. The optical film according to claim 1, wherein when seen in the direction normal to the film surface, a direction parallel with a surface including the directions respectively normal to the two first element side surfaces and the direction normal to the film surface forms an angle of 5 degrees or greater and 40 degrees or less or of 50 degrees or greater and 85 degrees or less with the first direction.

5. The optical film according to claim 1, wherein a direction parallel with a surface including the directions respectively normal to the two second element side surfaces and the direction normal to the film surface forms an angle of 5 degrees or greater and 40 degrees or less or of 50 degrees or greater and 85 degrees or less with the first direction.

6. The optical film according to claim 1, wherein when seen in the direction normal to the film surface, the optical film is rectangular, the first direction and the second direction are each nonparallel with four sides of the rectangular optical film, the four sides include two first sides that are opposite to each other and two second sides that are opposite to each other in a direction orthogonal to a direction in which the two first sides are opposite to each other, and when seen in the direction normal to the film surface, the two first element side surfaces are opposite to each other in a direction in which the second sides extend and the two second element side surfaces are opposite to each other in a direction in which the first sides extend.

7. The optical film according to claim 1, wherein ones of the optical elements adjacent to each other in the first direction are adjacent to each other at a gap from each other in either the direction in which the two first sides are opposite to each other or the direction in which the two second sides are opposite to each other, and a first duty defined by dividing a dimension at a midpoint of the direction normal to the film surface between the two first element side surfaces or the two second element side surfaces by a pitch between one of the optical elements and another in the first direction is greater than or equal to 0.5 and less than or equal to 0.8.

8. The optical film according to claim 1, wherein ones of the optical elements adjacent to each other in the second direction are adjacent to each other at a gap from each other in either the direction in which the two first sides are opposite to each other or the direction in which the two second sides are opposite to each other, and a second duty defined by dividing a dimension at a midpoint of the direction normal to the film surface between the two first element side surfaces or the two second element side surfaces by a pitch between one of the optical elements and another in the second direction is greater than or equal to 0.5 and less than or equal to 0.8.

9. The optical film according to claim 1, wherein each of the optical elements has a truncated quadrangular pyramidal shape and has a distal surface parallel to the film surface.

10. The optical film according to claim 9, wherein ridges of the side surface of each of the optical elements are made in round shapes.

11. The optical film according to claim 6, wherein the optical elements include first elements each of which is a diffraction grating that has a plurality of grooves depressed toward one side or another in the direction normal to the film surface and elongated in a direction parallel with the first sides and in which directions respectively normal to the first element side surfaces formed in each of the grooves are nonparallel with the surface including the first direction and the direction normal to the film surface and the surface including the second direction and the direction normal to the film surface, and second elements each of which is a diffraction grating that has a plurality of grooves depressed toward one side or another in the direction normal to the film surface and elongated in a direction parallel with the second sides and in which directions respectively normal to the second element side surfaces formed in each of the grooves are nonparallel with the surface including the first direction and the direction normal to the film surface and the surface including the second direction and the direction normal to the film surface, and the first elements and the second elements are mixedly arrayed in both the first direction and the second direction.

12. A display device comprising:

a display panel including a plurality of pixels arrayed in a first pixel array direction and a second pixel array direction orthogonal to the first pixel array direction; and the optical film according to claim 1, wherein the optical film is placed over the plurality of pixels so that the first direction and the second direction in which the optical elements are arrayed are each nonparallel with the first pixel array direction and the second pixel array direction, and when seen in a direction normal to a film surface of the optical film, directions respectively normal to the two first element side surfaces are parallel with the first pixel array direction and directions respectively normal to the two second element side surfaces are parallel with the second pixel array direction.

13. The display device according to claim 12, wherein the display panel is an organic LED panel or a liquid crystal panel.

14. The display device according to claim 13, wherein each of the pixels includes subpixels arrayed in a PenTile array.

15. The display device according to claim 14, wherein a pitch between one of the optical elements and another is half as great as or less than a width of each of the subpixels.

* * * * *